(12) United States Patent
Zhu

(10) Patent No.: US 7,619,276 B2
(45) Date of Patent: Nov. 17, 2009

(54) FINFET FLASH MEMORY DEVICE WITH AN EXTENDED FLOATING BACK GATE

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 11/830,328

(22) Filed: Jul. 30, 2007

(65) Prior Publication Data

US 2009/0032859 A1 Feb. 5, 2009

(51) Int. Cl.
H01L 29/78 (2006.01)
(52) U.S. Cl. .............................. 257/316; 257/E21.209
(58) Field of Classification Search ......... 257/314–316, 257/E21.209; 438/266
See application file for complete search history.

(56) References Cited

U.S. PATENT DOCUMENTS

| | | | |
|---|---|---|---|
| 6,445,032 B1 | 9/2002 | Kumar et al. | |
| 7,087,952 B2 | 8/2006 | Zhu et al. | |
| 2008/0079060 A1* | 4/2008 | Zhu | 257/321 |
| 2009/0026523 A1* | 1/2009 | Wong et al. | 257/316 |
| 2009/0039420 A1* | 2/2009 | Trivedi et al. | 257/329 |
| 2009/0065853 A1* | 3/2009 | Hanafi | 257/327 |
| 2009/0072276 A1* | 3/2009 | Inaba | 257/255 |

* cited by examiner

Primary Examiner—Nathan W Ha
(74) Attorney, Agent, or Firm—Scully, Scott, Murphy & Presser, P.C.; H. Daniel Schnurmann

(57) ABSTRACT

A floating gate is formed on one side of the semiconductor fin on a floating gate dielectric. A control gate dielectric is formed on the opposite side of the semiconductor fin and on the floating gate. A gate conductor is formed on the control gate dielectric across the semiconductor fin. A gate spacer reaching above a gate cap layer and the control gate dielectric thereupon is formed by a conformal deposition of a dielectric layer and a reactive ion etch. The control gate dielectric and the material of the floating gate are removed from exposed portions of the semiconductor fin. The gate spacer is thereafter removed and source and drain regions are formed in the semiconductor fin. The overlap between the drain and the floating gate is extended by the thickness of the gate spacer, resulting in an enhanced efficiency in charge trapping in the floating gate.

20 Claims, 41 Drawing Sheets

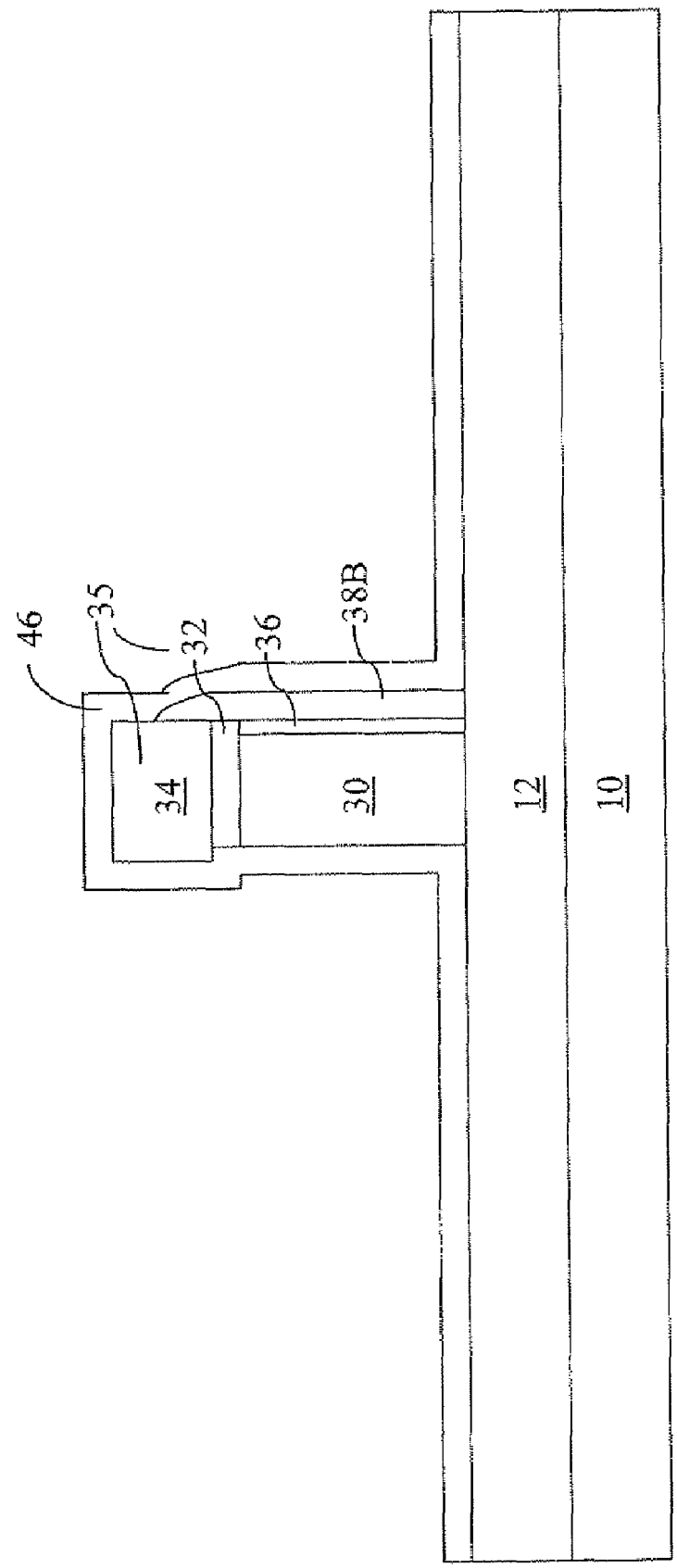

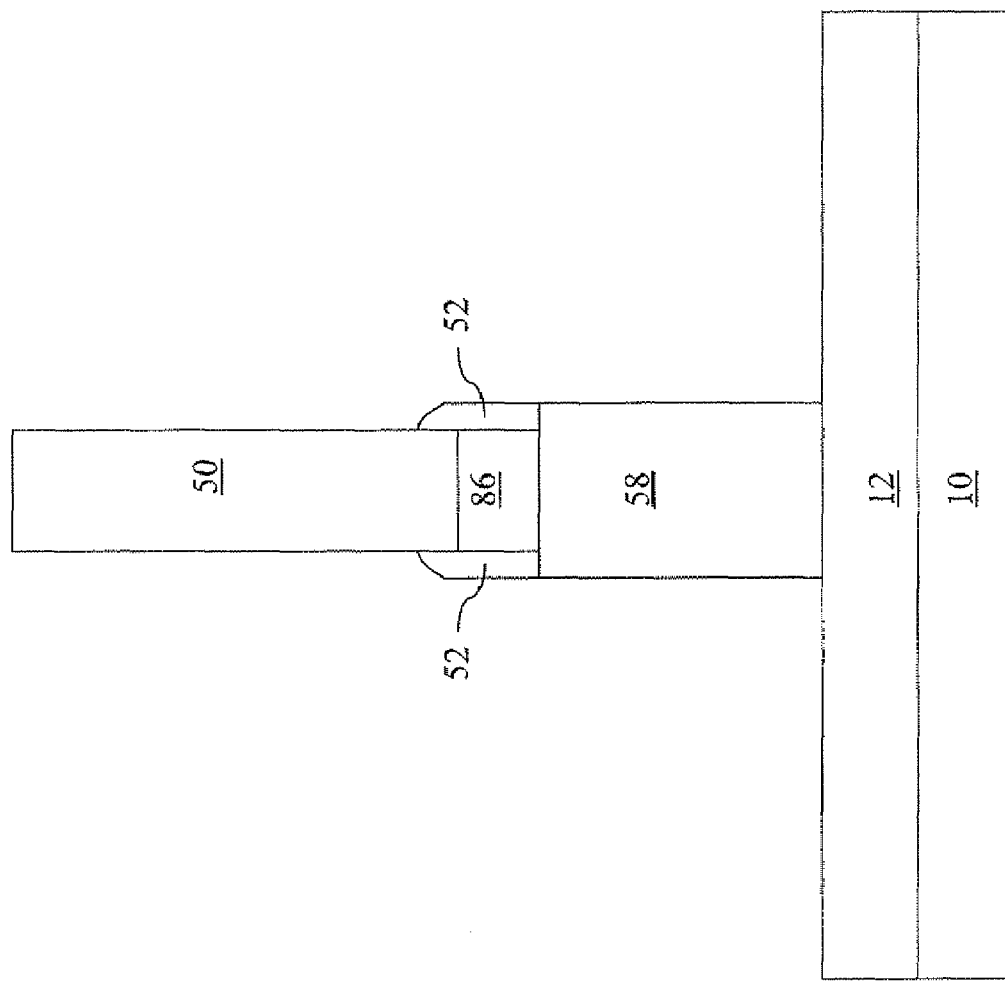

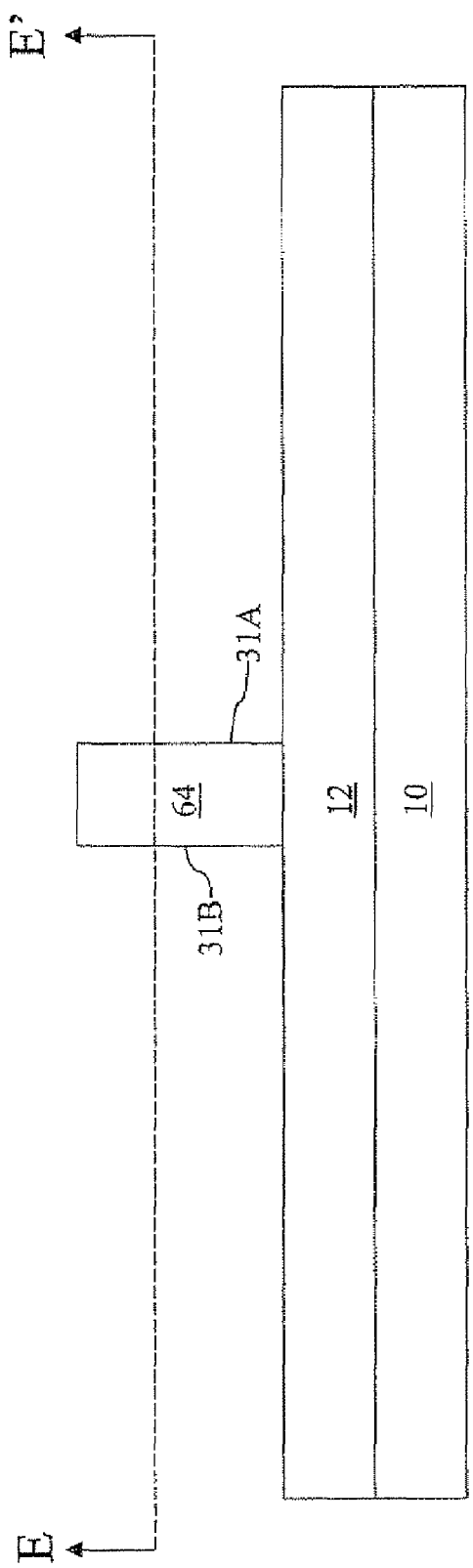

FINFET FLASH MEMORY DEVICE WITH AN EXTENDED FLOATING BACK GATE

FIELD OF THE INVENTION

The present invention relates to semiconductor devices, and particularly, to a flash memory device comprising a semiconductor-on-insulator (SOI) fin field effect transistor (finFET) having an extended floating back gate and methods of manufacturing the same.

BACKGROUND OF THE INVENTION

A flash memory device employs a metal-oxide-semiconductor field effect transistor (MOSFET) having a floating gate which affects a threshold voltage Vt of the MOSFET. The flash memory device thus comprises a control gate which functions in the same manner as a normal gate of a conventional MOSFET and a floating gate which is separated from a channel of the MOSFET by a dielectric material, or a "floating gate dielectric," but affects the operation of the MOSFET through control of the threshold voltage of the MOSFET. The charge stored in the floating gate is preserved even when a semiconductor chip is powered off. Thus, the flash memory device is a non-volatile memory device, and is typically referred to as an electrically erasable and programmable memory (EEPROM) device.

The floating gate stores a variable amount of charge which tunnels through the floating gate dielectric. A typical floating gate dielectric comprises a silicon oxide based material, e.g., silicon oxide or a stack of silicon oxide and silicon nitride. The amount of charge stored in the floating gate is dependent on bias conditions of the control gate, the drain, the source, and the body as well as the composition and thickness of the floating gate dielectric and the efficiency of charge trapping by the floating gate that is typically generated in the drain of the MOSFET by a hot, or energetic, charge carriers, i.e., hot electrons. The efficiency of charge trapping is a function of the degree of overlap of the floating gate with the drain of the MOSFET since the hot charge carriers are scattered in many directions from the drain. Typically, the floating gate is in one of the binary states i.e., a charged state and a discharged state. In the charged state, the floating gate stores a significant amount of charges, for example, electrons, to dispel electrons and attract holes in the channel of the MOSFET to alter the threshold voltage of the MOSFET. In the discharged state, the floating gate has an insignificant amount of charge, and effectively, does not alter the threshold voltage of the MOSFET. Thus, a binary bit of information may be stored in the form of electrical charges in the floating gate, and the binary bit of information may be read by measuring the threshold voltage of the MOSFET, typically by measuring the on-current of the MOSFET at a given bias condition.

In general, flash memory devices having a floating gate and a control gate on the same side of the channel of a MOSFET face difficulties in scaling of the gate dielectric since the gate dielectric is shared by the floating gate and the control gate. While it is advantageous to employ a thinner gate dielectric to enhance performance of the MOSFET, such reduction in the thickness of the gate dielectric tends to increase leakage of charge from the floating gate. In practice, there is an optimum gate dielectric thickness for the floating gate, and indefinite scaling of the gate dielectric is not desirable for the floating gate.

U.S. Pat. No. 6,445,032 to Kumar et al. discloses a prior art flash memory device employing a planar MOSFET. A control gate is formed on a control gate dielectric located on one side of the channel, while a floating gate is formed on a floating gate dielectric located on the back side of the MOSFET, i.e., on the opposite side of the channel. Thus, the control gate dielectric may be scaled to enhance performance of the planar MOSFET, while the thickness of the floating gate dielectric is set at an optimal thickness. However, it is difficult to form self-aligned double gate flash device with a structure of a planar MOSFET.

Fin metal-oxide-semiconductor field effect transistor (FinMOSFET) is an emerging technology which provides solutions to metal-oxide-semiconductor field effect transistor (MOSFET) scaling problems at, and below, the 45 nm node. FinMOSFET structures include fin field effect transistors (finFETs), which comprise at least one narrow (preferably <30 nm wide) semiconductor fin gated on at least two opposing sides of each of the at least one semiconductor fin. Preferred prior art finFET structures are formed on a semiconductor-on-insulator (SOI) substrate, because of low source/drain diffusion to substrate capacitance and ease of electrical isolation by shallow trench isolation structures.

In a finFET, a gate electrode located on at least two sides of the channel of the transistor is a common feature of finFETs known in the art. Due to the advantageous feature of full depletion in a finFET, the increased number of sides on which the gate electrode controls the channel of the finFET enhances the controllability of the channel in a finFET compared to a planar MOSFET. The improved control of the channel allows smaller device dimensions with less short channel effects as well as larger electrical current that can be switched at high speeds. A finFET device has faster switching times, equivalent or higher current density, and much improved short channel control than the mainstream CMOS technology utilizing similar critical dimensions.

In a typical finFET structure, at least one horizontal channel on a vertical sidewall is provided within the semiconductor "fin" that is set sideways, or edgewise, upon a substrate. Typically, the fin comprises a single crystalline semiconductor material with a substantially rectangular cross-sectional area. Also typically, the height of the fin is greater than width of the fin to enable higher on-current per unit area of semiconductor area used for the finFET structure. In order to obtain desirable control of short channel effects (SCEs), the semiconductor fin is thin enough in a device channel region to ensure forming fully depleted semiconductor devices. Typically, the thickness, or the horizontal width, of a fin in a finFET is less than two-thirds of its gate length in order to obtain good control of the short channel effect.

Employment of finFETs in semiconductor devices requires different semiconductor processing steps than planar FETs, and therefore, a flash memory device having a manufacturing sequence that is compatible with a manufacturing sequence of finFETs is needed. U.S. Pat. No. 7,087,952 to Zhu et al., provides a prior art flash memory device employing a semiconductor fin, thus providing a non-volatile programmable memory that is compatible with finFET devices. However, the prior art device according to Zhu et al. employs the same gate lengths for both control and floating gates. Thus, it is difficult to form a structure having a larger overlap capacitance on the floating gate than on the control gate, and in general, it is difficult to form a structure having different overlap capacitance between the control and the floating gate. In other words, a structure having the same gate length for the control gate and the floating gate is not conducive for charging and discharging of the floating gate as needed in a non-volatile memory.

In view of the above, there exists a need to provide a finFET based flash memory device structure having a control gate that may be scaled independently from a floating gate.

Therefore, there exists a need to provide a finFET based flash memory device structure having an extended overlap between a drain of the finFET and a floating gate.

SUMMARY OF THE INVENTION

The present invention addresses the needs described above by providing a flash memory structure comprising a finFET having a control gate dielectric on one side of a semiconductor fin and an independently formed floating gate dielectric on the opposite side, in which a drain of the finFET and a floating gate have an extended overlap, and methods of manufacturing the same.

According to the present invention, a floating gate dielectric is formed on sidewalls of a semiconductor fin. A floating gate is formed on one side of the semiconductor fin over the floating gate dielectric. A control gate dielectric is formed on the floating gate and on the sidewall of the semiconductor fin located on the opposite side of the floating gate. A gate conductor is formed on the control gate dielectric across the semiconductor fin. A gate spacer reaching above a gate cap layer and the control gate dielectric thereupon is formed by a conformal deposition of a dielectric layer and a reactive ion etch. The control gate dielectric and the material of the floating gate are removed from exposed portions of the semiconductor fin. The gate spacer is thereafter removed and source and drain regions are formed in the semiconductor fine. The overlap between the drain and the floating gate is extended by the thickness of the gate spacer, resulting in an enhanced efficiency in charge trapping in the floating gate.

According to an aspect of the present invention, a semiconductor structure is provided, which comprises:
  a semiconductor fin comprising a semiconductor material and located on a substrate;
  a floating gate dielectric abutting a sidewall of the semiconductor fin;
  a floating gate laterally abutting the floating gate dielectric and having a floating gate length;
  a control gate dielectric laterally abutting the floating gate and another sidewall of the semiconductor fin; and
  a control gate abutting the control gate dielectric and having a control gate length, wherein the floating gate length is greater than the control gate length.

In one embodiment, the semiconductor fin comprises:
  a channel region laterally abutting the floating gate dielectric and the control gate dielectric and having a first conductivity type doping; and
  a drain region laterally abutting the channel region and having a second conductivity type doping, wherein the second conductivity type is the opposite of the first conductivity type, and wherein the drain region overlaps with the floating gate through the floating gate dielectric by a floating gate to drain overlap length, and wherein the drain region overlaps with the control gate through the control gate dielectric by a control gate to drain overlap length, and wherein the floating gate to drain overlap length is greater than the control gate to drain overlap length.

In another embodiment, the semiconductor fin further comprises a source region laterally abutting the channel region and having the second conductivity type doping, wherein the source region overlaps with the floating gate through the floating gate dielectric by a floating gate to source overlap length, and wherein the source region overlaps with the control gate through the control gate dielectric by a control gate to source overlap length, and wherein the floating gate to source overlap length is greater than the control gate to source overlap length.

In even another embodiment, the floating gate to drain overlap length is substantially the same as the floating gate to source overlap length, and wherein the control gate to drain overlap length is substantially the same as the control gate to source overlap length.

In yet another embodiment, the semiconductor structure further comprises at least one fin cap dielectric portion abutting the semiconductor fin, the control gate dielectric, and the floating gate.

In still another embodiment, the at least one fin cap dielectric portion comprises:
  a first fin cap dielectric portion vertically abutting the semiconductor fin and abutting the control gate dielectric and the floating gate; and
  a second fin cap dielectric portion vertically abutting the first fin cap dielectric portion and abutting the control gate dielectric.

In still yet another embodiment, a length of the control gate dielectric is the same as the floating gate length.

In a further embodiment, the floating gate dielectric and the control gate dielectric have different effective oxide thicknesses.

In an even further embodiment, the floating gate dielectric and the control gate dielectric comprise different materials.

In a yet further embodiment, the floating gate dielectric is one of silicon oxide, silicon nitride, silicon oxynitride, and a stack thereof, and wherein the control gate dielectric comprises a high-k dielectric material.

In a still further embodiment, the high-k dielectric material is one of $HfO_2$, $ZrO_2$, $La_2O_3$, $Al_2O_3$, $TiO_2$, $SrTiO_3$, $LaAlO_3$, $Y_2O_3$, an alloy thereof, and a silicate thereof.

In a still yet further embodiment, the semiconductor fin comprises silicon and the floating gate comprises a silicon germanium alloy.

In further another embodiment, the another sidewall is located on an opposite side of the sidewall, and wherein the substrate comprises a handle substrate and a buried insulator layer, wherein the buried insulator layer vertically abuts the handle substrate and the semiconductor fin.

According to another aspect of the present invention, a method of forming a semiconductor structure is provided, which comprises:
  forming a semiconductor fin comprising a semiconductor material on a substrate;
  forming a floating gate dielectric directly on a sidewall of the semiconductor fin;
  forming a floating gate layer directly on the floating gate dielectric;
  forming a control gate dielectric layer directly on another sidewall of the semiconductor fin and the floating gate;
  forming a control gate having a control gate length in a lengthwise direction of the semiconductor fin directly on the control gate dielectric;
  forming a gate spacer having a gate spacer thickness on gate electrode sidewalls; and
  removing exposed portions of the floating gate layer employing the gate electrode and the gate spacer as an etch mask to form a floating gate having a floating gate length, wherein the floating gate length is greater than the control gate length.

In one embodiment, the method further comprises removing exposed portions of the control gate dielectric at the same step as the removing of the exposed portions of the floating gate layer to form a control gate dielectric having the floating gate length.

In another embodiment, the method further comprises:
forming the floating gate dielectric directly on another sidewall of the semiconductor fin located on an opposite side of the sidewall;
etching the floating gate layer by a reactive ion etch to form a floating gate spacer around the semiconductor fin; and
removing one side of the floating gate spacer.

In even another embodiment, the floating gate length is the same as the sum of the control gate length and twice the gate spacer thickness.

DETAILED DESCRIPTION OF THE INVENTION

Figure 1A:
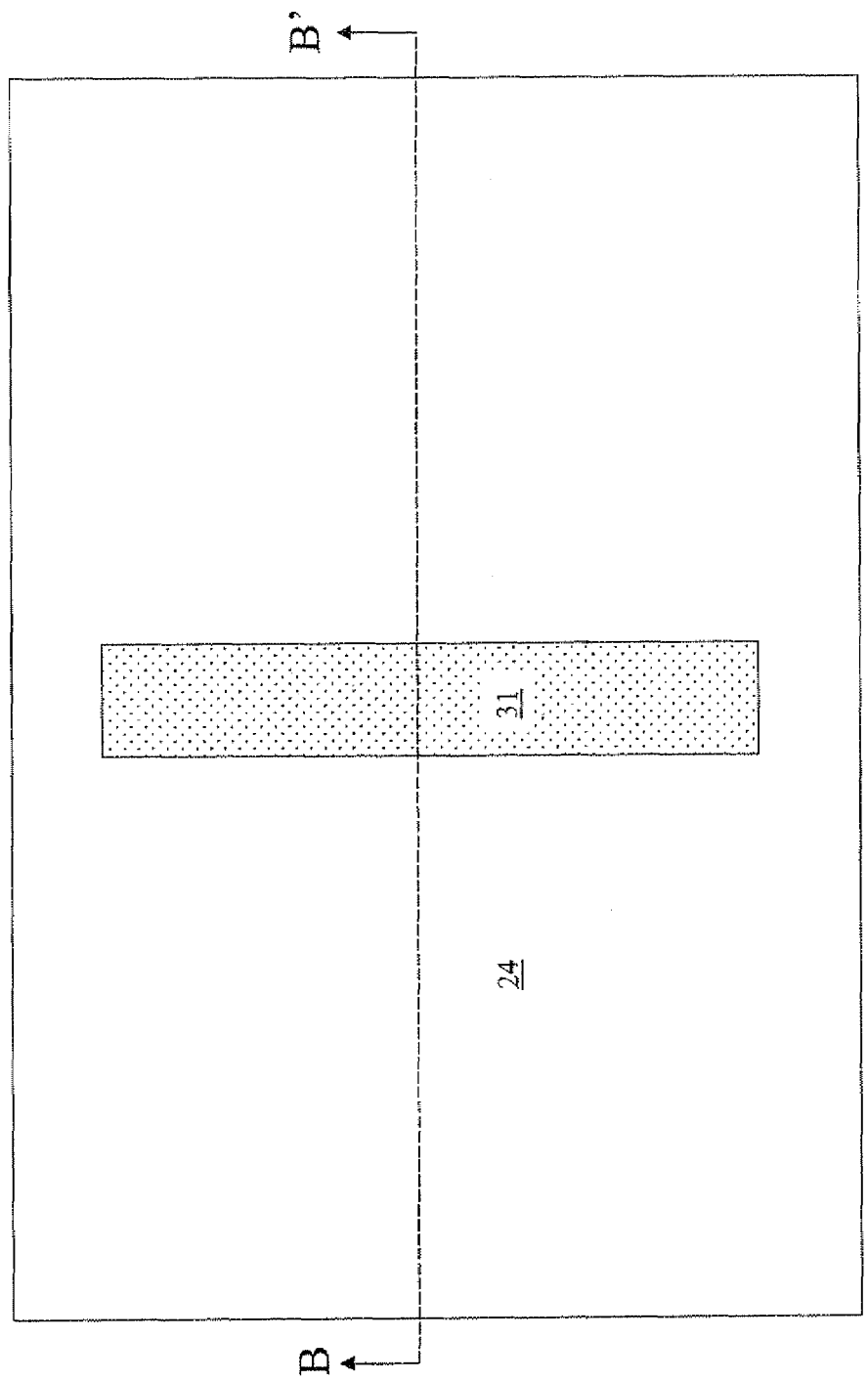
FIGS. 1A-15E are various sequential views of an exemplary semiconductor structure according to the present invention. Figures with the same numeric label correspond to the same stage of manufacturing. Figures with the suffix "A" are top-down views. Figures with the suffix "B," "C," or "D" are vertical cross-sectional views along the plane B-B', C-C', or D-D', respectively, of the corresponding figure with the same numeric label and the suffix "A." Figures with the suffix "E" are horizontal cross-sectional views along the plane E-E' of the corresponding figures with the same numeric label and the suffix "B," "C," or "D."

As stated above, the present invention relates to a flash memory device comprising a semiconductor-on-insulator (SOI) fin field effect transistor (finFET) having an extended floating back gate and methods of manufacturing the same, which are now described in detail with accompanying figures. It is noted that like and corresponding elements are referred to by like reference numerals.

Figure 1B:
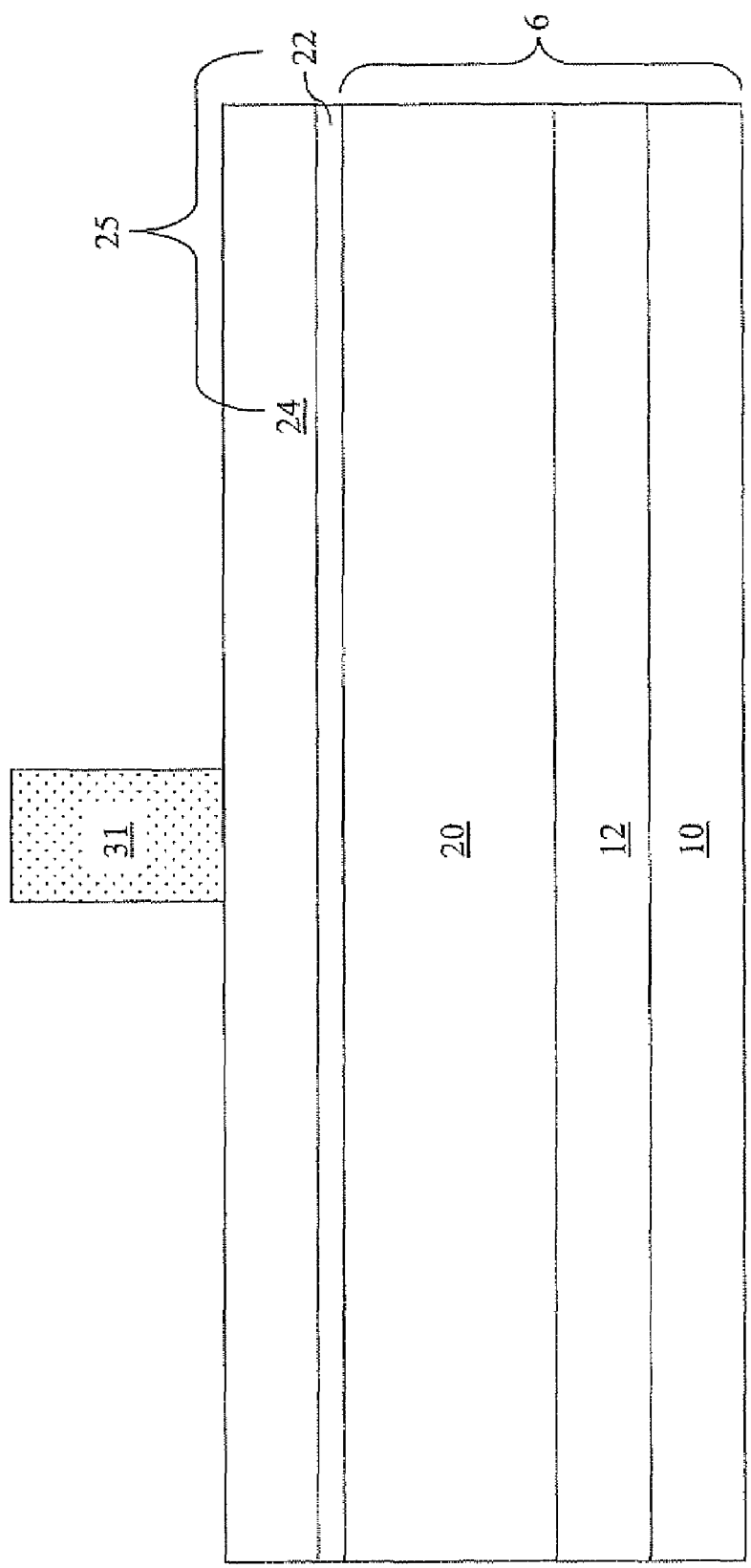

Referring to FIGS. 1A and 1B, a first exemplary semiconductor structure according to the present invention comprises an SOI substrate 6 containing a handle substrate 10, a buried oxide layer 12, and a top semiconductor layer 20. The top semiconductor layer 20 comprises a semiconductor material. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In an exemplary embodiment, the semiconductor material comprises silicon. Preferably, the top semiconductor layer 20 is single crystalline. The top semiconductor layer 20 may be doped with electrical dopants of a first conductivity type. The electrical dopants may be at least one of p-type dopants such as B, Ga, and In. Alternately, the electrical dopants may be at least one of n-type dopants such as P, As, and Sb. The type of doping of the top semiconductor layer 20 is herein referred to as a first conductivity type doping, which may be a p-type doping or an n-type doping. The concentration of the electrical dopants may be from about $1.0 \times 10^{15}$ atoms/cm$^3$ to about $1.0 \times 10^{19}$ atoms/cm$^3$. Non-electrical stress-generating dopants such as Ge and/or C may also be present. The top semiconductor layer 20 has a thickness from about 40 nm to about 100 nm, although greater and lesser thicknesses are also contemplated herein.

While the present invention is described with a top semiconductor layer 20 located in an SOI substrate 6, the present invention may be implemented on a bulk substrate, a hybrid substrate, and/or on an insulator substrate in which the handle substrate 10 and the buried insulator layer 12 are replaced with other materials. Such variations are explicitly contemplated herein.

At least one fin cap dielectric layer 25 is formed on the top semiconductor layer 20. The at least one fin cap dielectric layer 25 may comprise multiple dielectric layers. For example, the at least one fin cap dielectric layer 25 may comprise a first fin cap dielectric layer 22 formed directly on the top semiconductor layer 20 and a second fin cap dielectric layer 24 formed on the first fin cap dielectric layer 22. The first fin cap dielectric layer 22 comprises a first fin cap dielectric material such as silicon oxide. The second fin cap dielectric layer 24 comprises a second fin cap dielectric material such as silicon nitride. The first fin cap dielectric layer 22 has a thickness from about 3 nm to about 50 nm, and typically from about 5 nm to about 20 nm. The second fin cap dielectric layer 24 has a thickness from about 10 nm to about 100 nm, and typically from about 20 nm to about 60 nm.

A first photoresist 31 is applied to the at least one gate cap layer 25 and lithographically patterned in the shape of a semiconductor fin to be subsequently formed as seen in a top-down view. The shape of the semiconductor fin may be substantially rectangular.

Figure 2A:
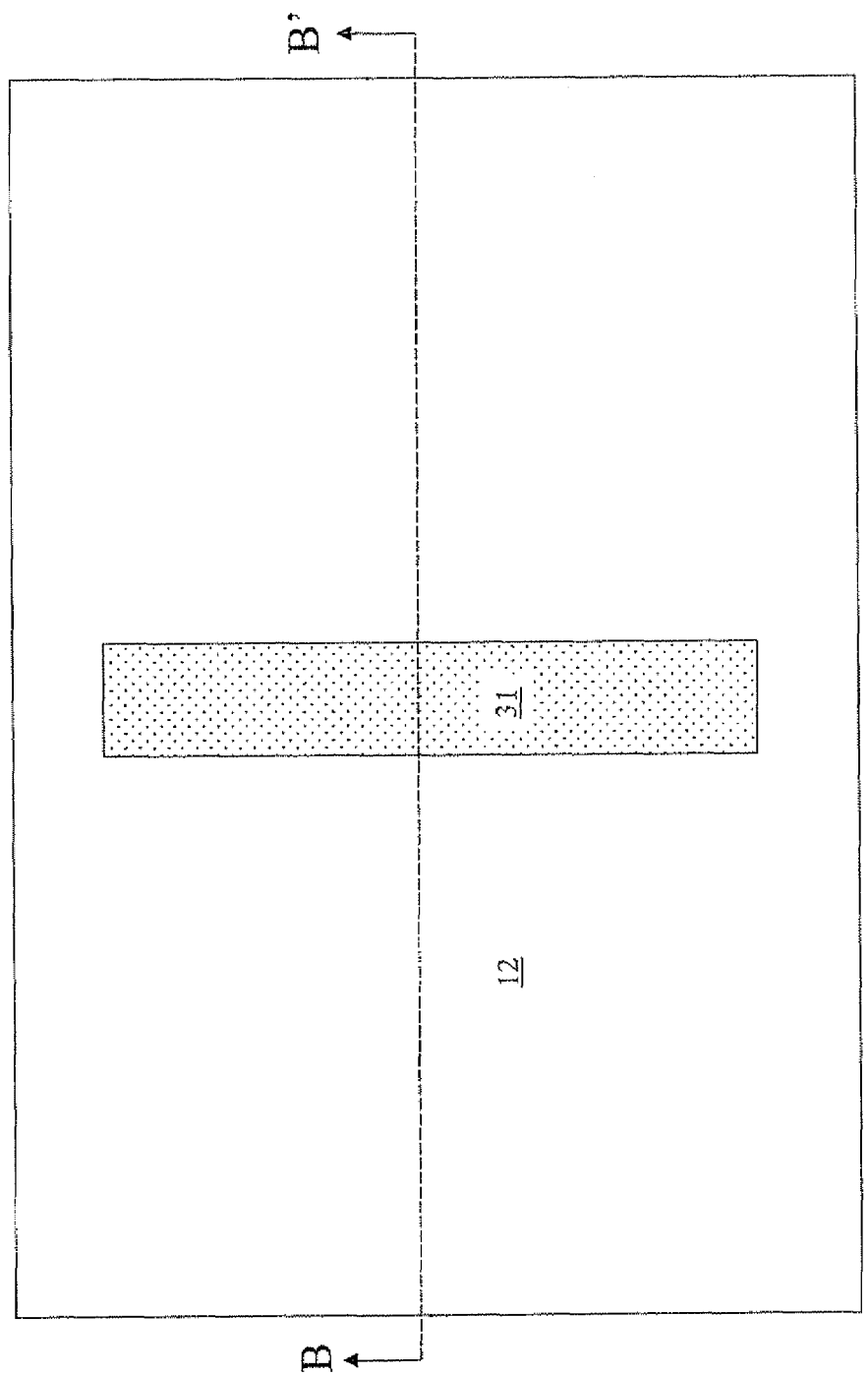
Figure 2B:
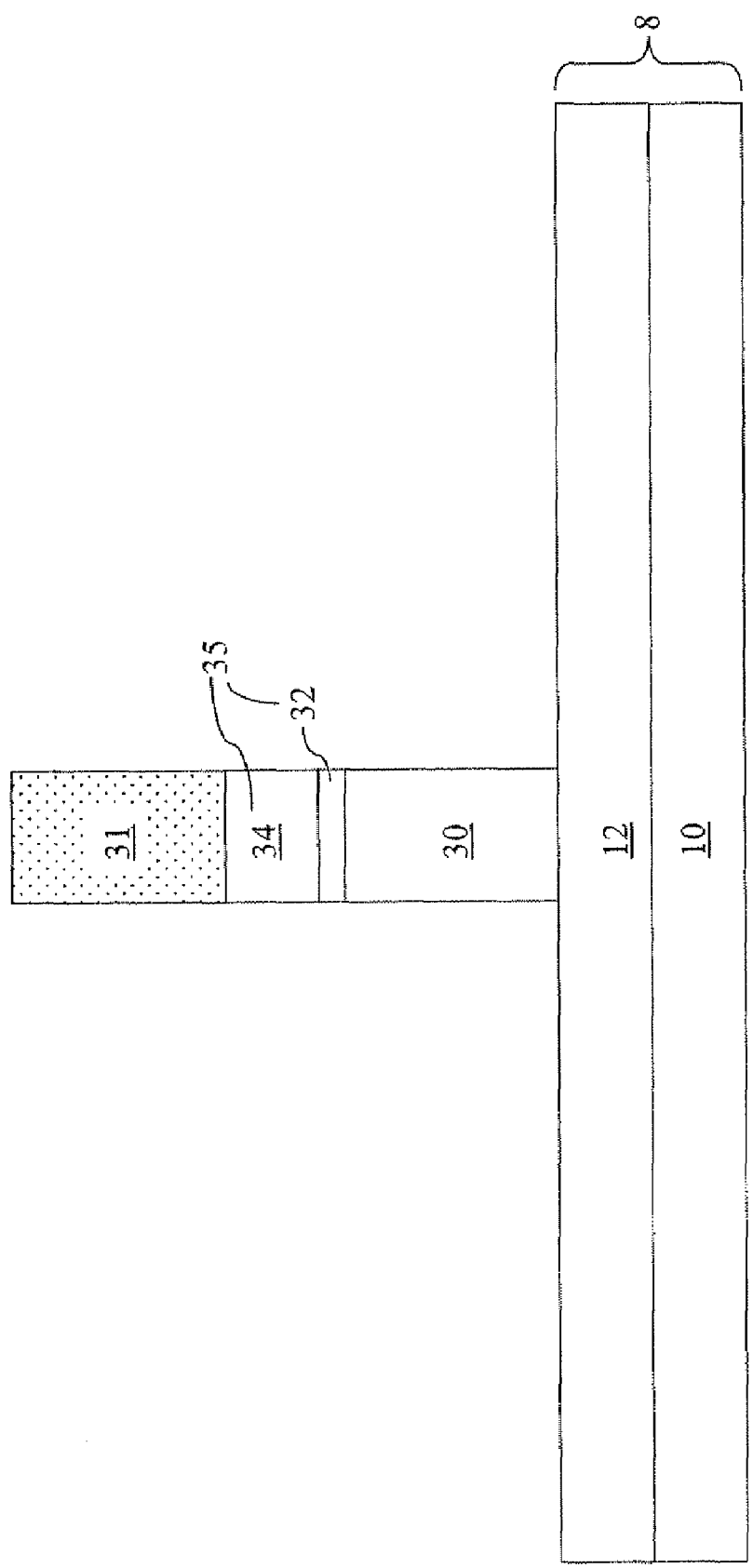

Referring to FIGS. 2A and 2B, the pattern in the first photoresist 31 is transferred into the at least one gate cap layer 25 and into the top semiconductor layer by a reactive ion etch. The remaining portion of the at least one gate cap layer 25 constitutes at least one gate cap portion 35, and the remaining portion of the top semiconductor layer 20 constitutes a semiconductor fin 30. In the case when the at least one gate cap layer 25 comprises a first gate cap layer 22 and a second gate cap layer 24, the at least one gate cap portion 35 comprises a first gate cap portion 32 and a second gate cap portion 34. The first gate cap portion 32 comprises the first fin cap dielectric material and vertically abuts the semiconductor fin 30. The second gate cap portion 34 comprises the second fin cap dielectric material. The thicknesses of the first gate cap portion 32 and the second gate cap portion 34 are substantially the same as the thicknesses of the first gate cap layer 22 and the second gate cap layer 24, respectively. The first photoresist 31 is thereafter removed, for example, by ashing. The handle substrate 10 and the buried insulator layer 12 collectively constitute a substrate 8.

Figure 3A:
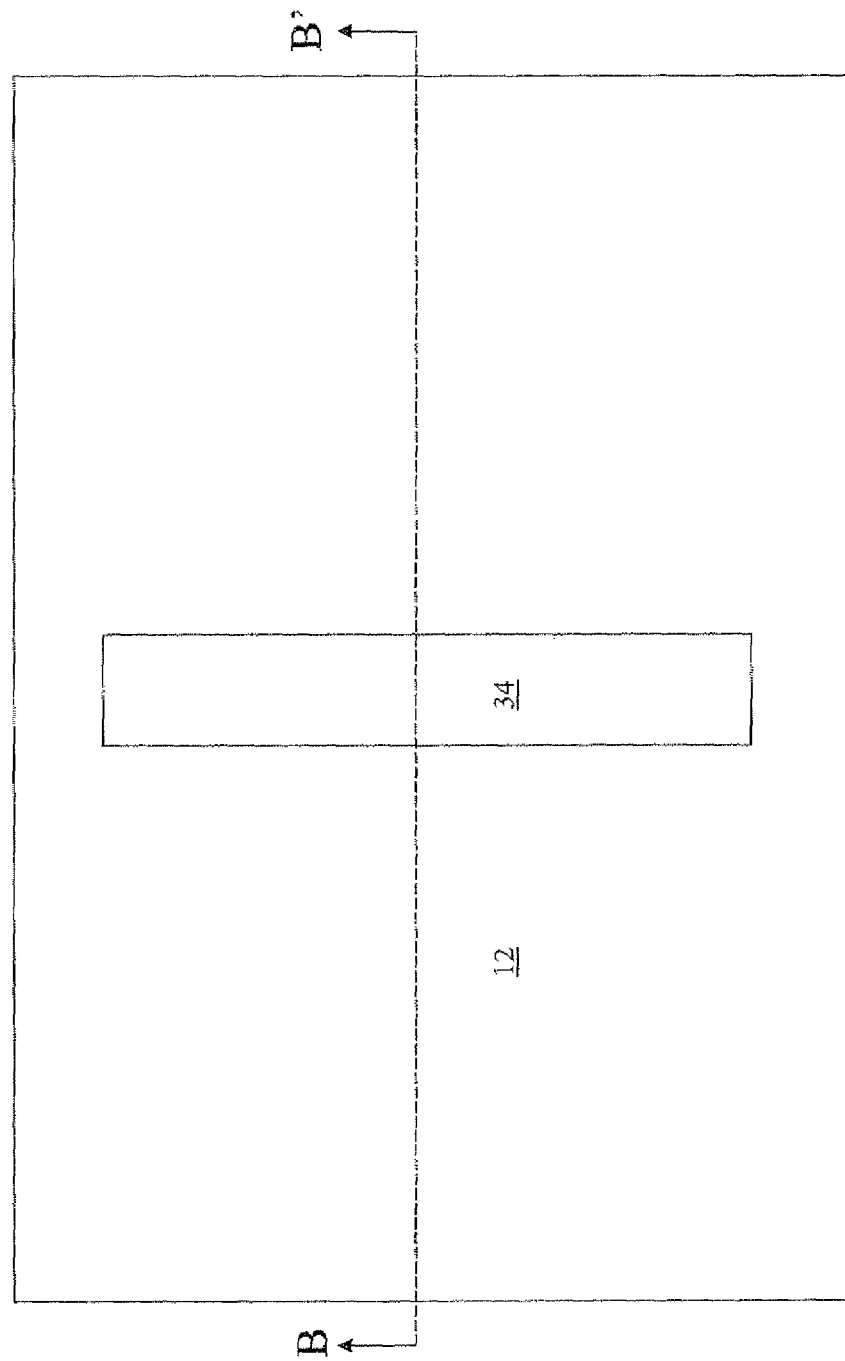
Figure 3B:
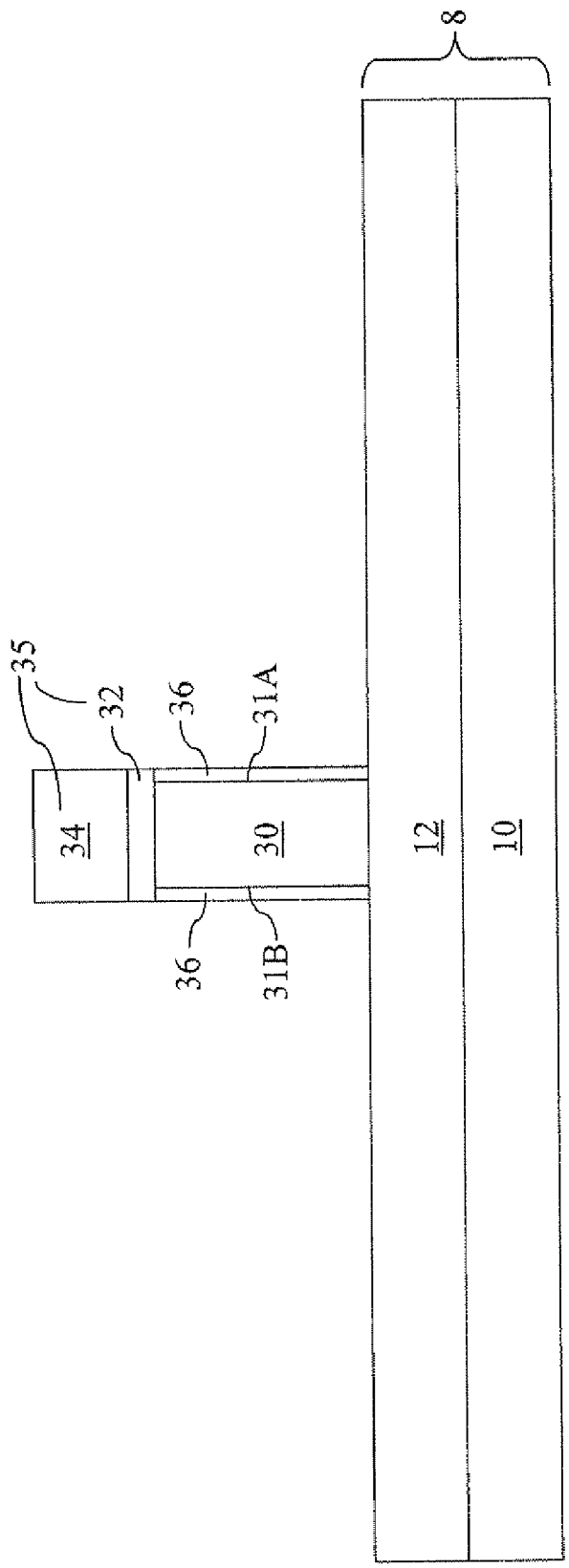

Referring to FIGS. 3A and 3B, a floating gate dielectric 36 is formed on sidewalls of the semiconductor fin 30. Specifically, the floating gate dielectric 36 is formed on a first sidewall 31A on one side of the semiconductor fin 30 and on a second sidewall 31B on an opposite side of the semiconductor fin 30 from the first sidewall 31A. The floating gate dielectric 36 laterally surrounds the sidewalls of the semiconductor fin 30 and has a unitary construction, i.e., the floating gate dielectric 36 has a shape that is topologically homeomorphic to a torus and may be continually stretched and bent to a torus without forming or destroying a singularity in a one-to-one mapping.

The floating gate dielectric 36 comprises a dielectric material optimized for tunneling and storing of electrical charges. The floating gate dielectric 36 has an equivalent oxide thickness (EOT), which is herein referred to as a "floating gate dielectric EOT," and optimized for tunneling and storing of electrical charges. The floating gate dielectric 36 may comprise a dielectric material formed by thermal conversion of a portion of the semiconductor fin, such as silicon oxide or silicon nitride. Alternately, the floating gate dielectric 36 may comprise a high-k dielectric material having a dielectric constant greater than 3.9, i.e., the dielectric constant of silicon oxide. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, an alloy thereof, and a silicate thereof. The high-k dielectric material may be formed by methods well known in the art including, for example, a chemical vapor deposition (CVD), an atomic layer deposition (PVD), molecular beam epitaxy (MBE), pulsed laser deposition (PLD), liquid source misted chemical deposition (LSMCD), etc.

Figure 4A:
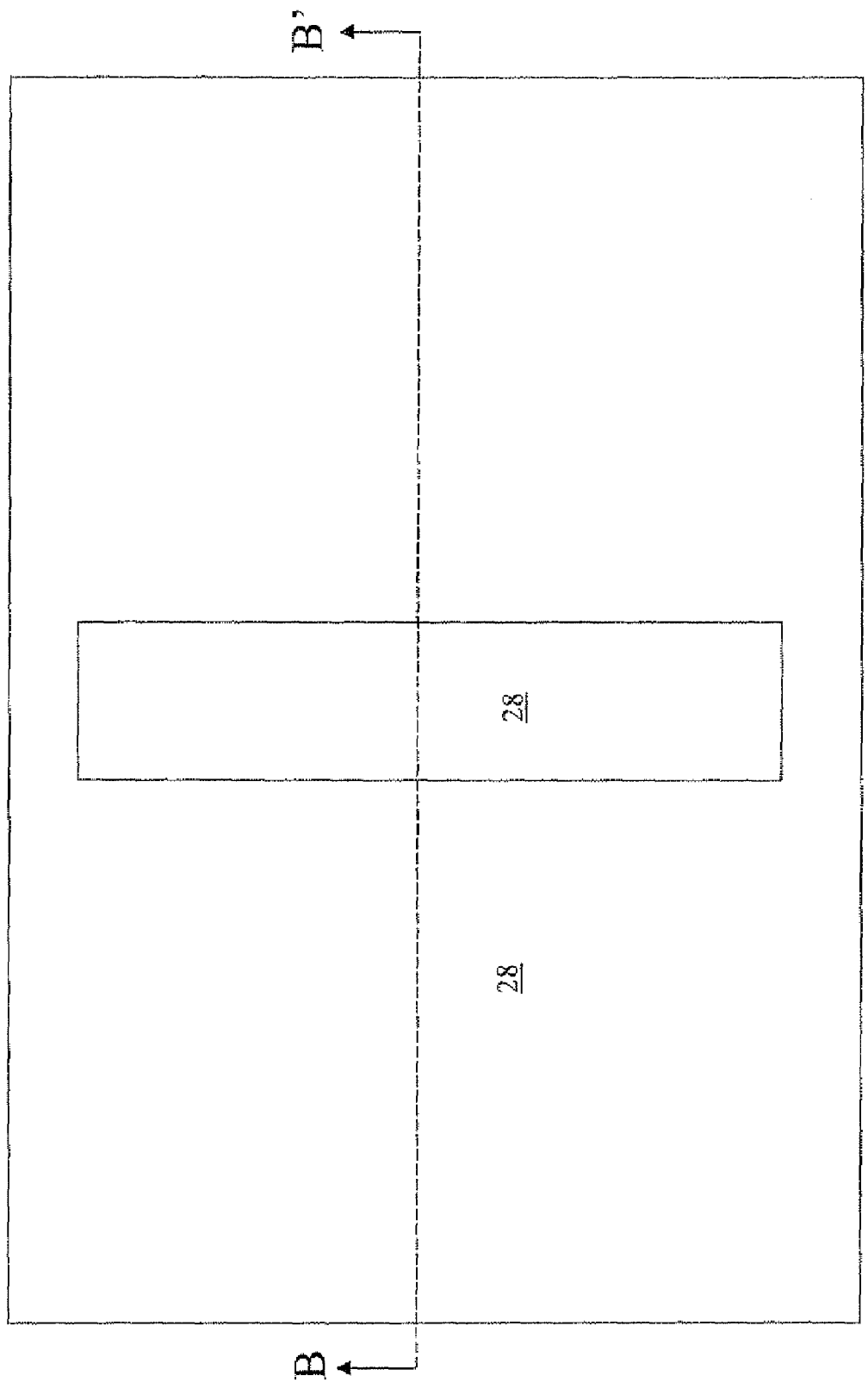
Figure 4B:
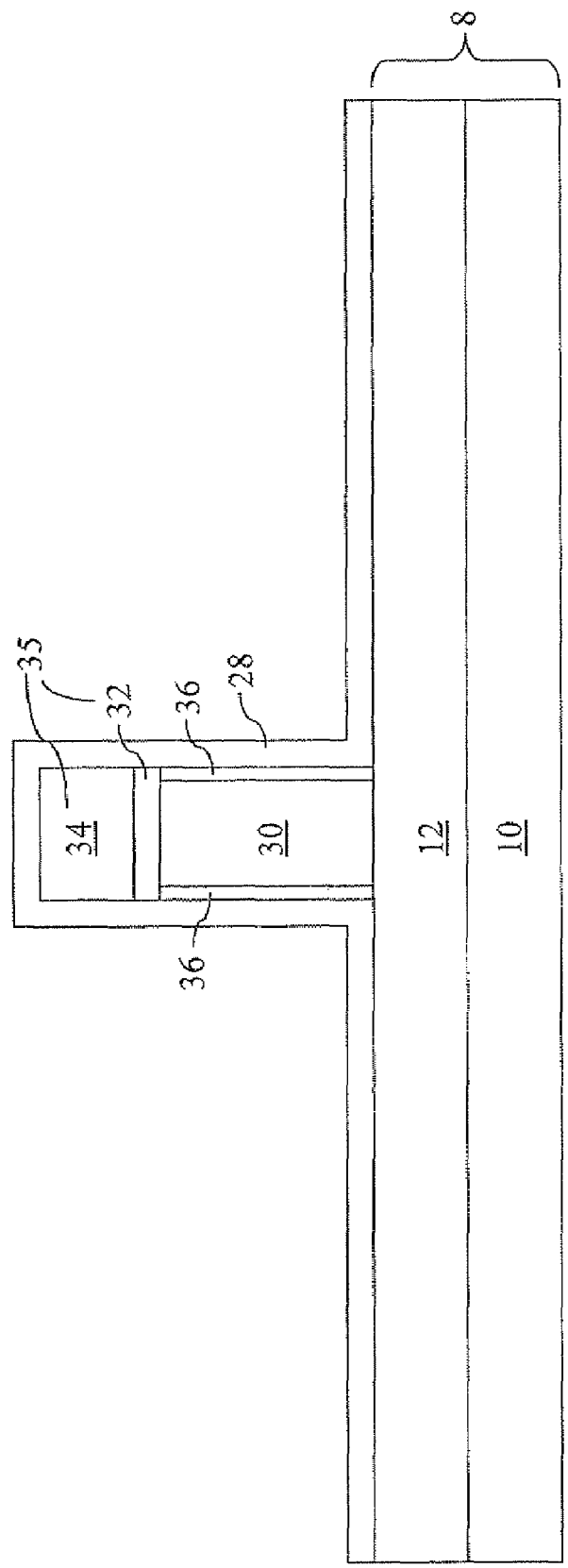

Referring to FIGS. 4A and 4B, a floating gate layer 28 is deposited on the floating gate dielectric 36, the at least one fin cap dielectric portion 35, and the buried insulator layer 12 by a conformal deposition process. The floating gate layer 28 comprises a semiconductor material that is subsequently employed for a floating gate. For example, the floating gate layer 28 may comprise amorphous silicon, polysilicon, amorphous silicon germanium alloy, or a polycrystalline silicon germanium alloy. In one embodiment, the floating gate comprises silicon and the floating gate layer 28 comprise a silicon germanium alloy having a germanium concentration from about 0.5% to about 20%, and preferably from about 2% to about 5%.

The floating gate layer 28 may be formed by chemical vapor deposition such as low pressure chemical vapor deposition (LPCVD). The thickness of the floating gate layer 28 may be from about 5 nm to about 100 nm, and preferably from about 10 nm to about 30 nm.

Figure 5A:
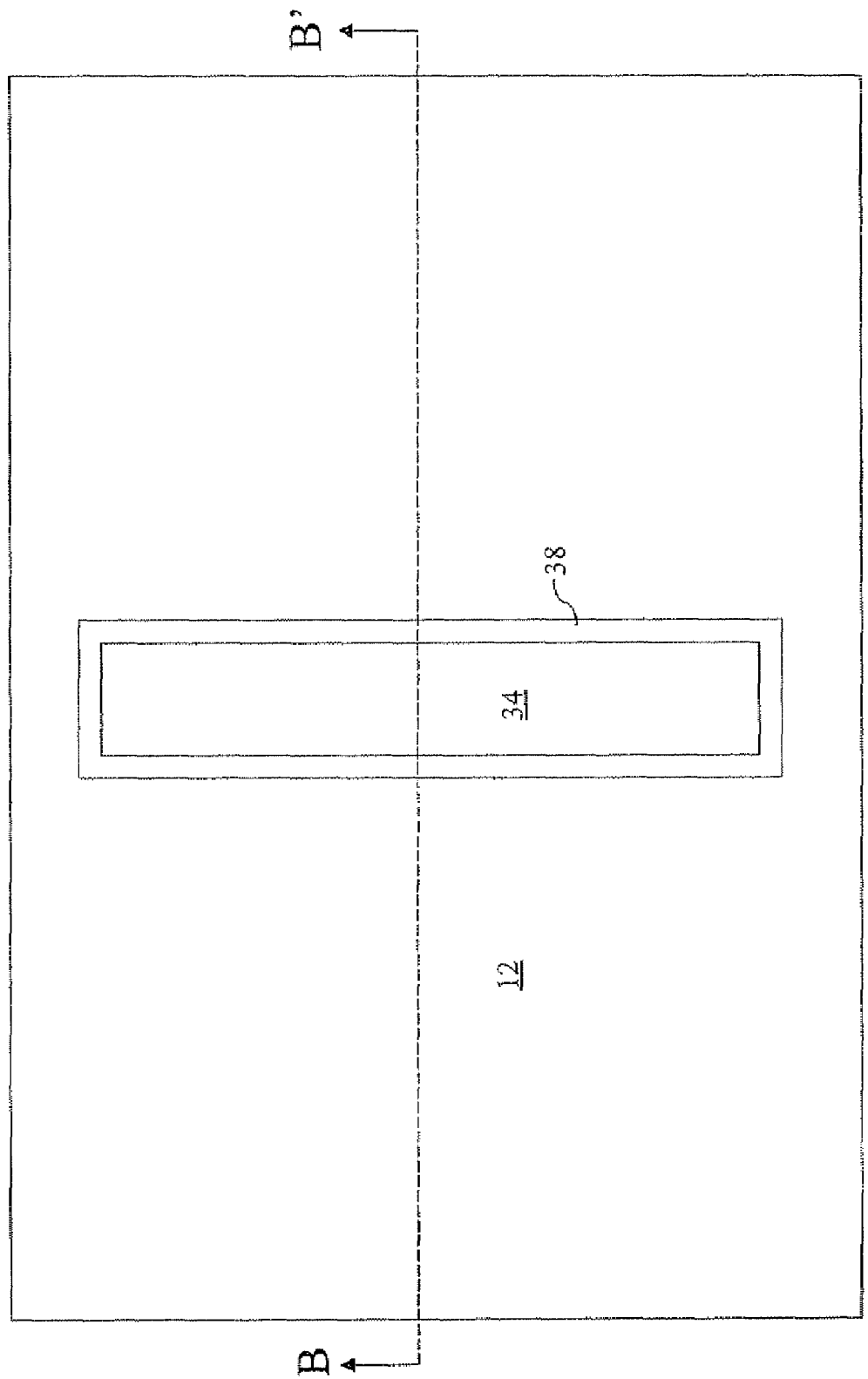
Figure 5B:
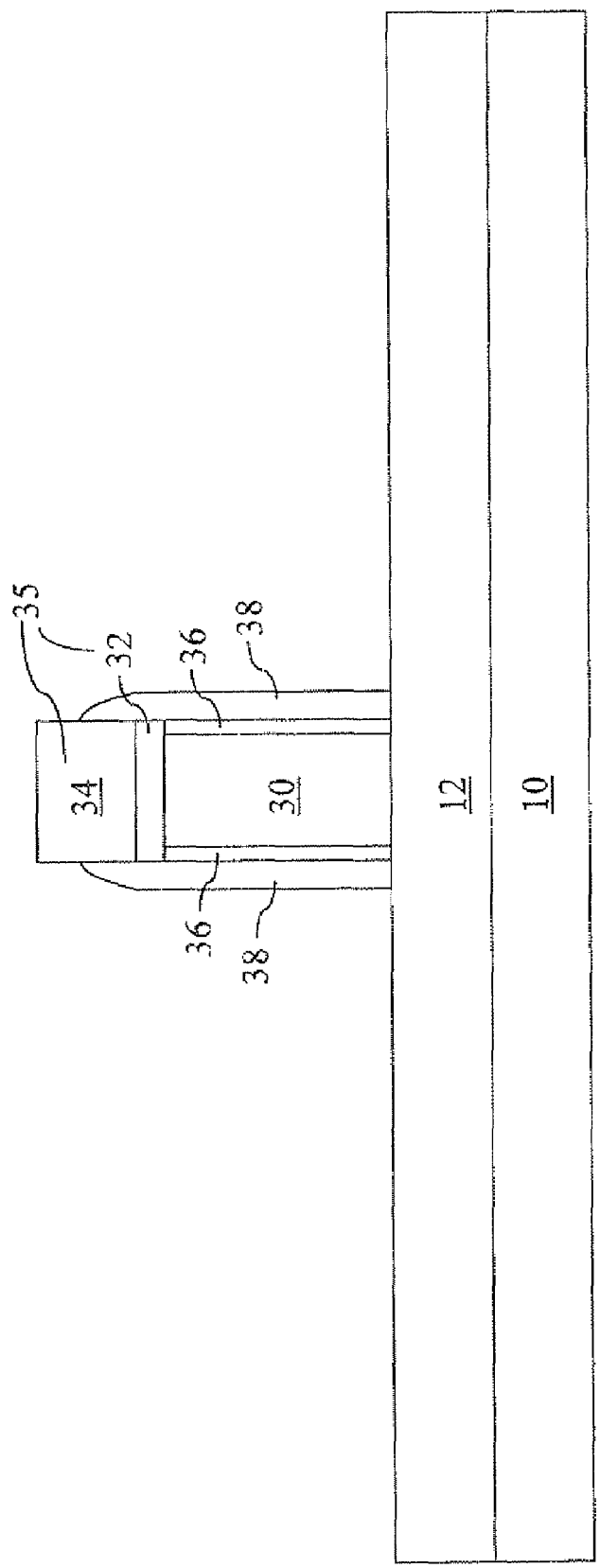

Referring to FIGS. 5A and 5B, an anisotropic reactive ion etch is performed on the floating gate layer 28 to form a floating gate spacer 38 that laterally surrounds the semiconductor fin 30 and the floating gate dielectric 36. The lateral thickness of the floating gate spacer 38 is substantially the same as the thickness of the floating gate layer 28. The floating gate spacer 38 laterally abuts the floating gate dielectric 36 and the at least one fin cap dielectric portion 35. A top surface of the at least one fin cap dielectric portion 35 is exposed after the anisotropic reactive ion etch.

Figure 6A:
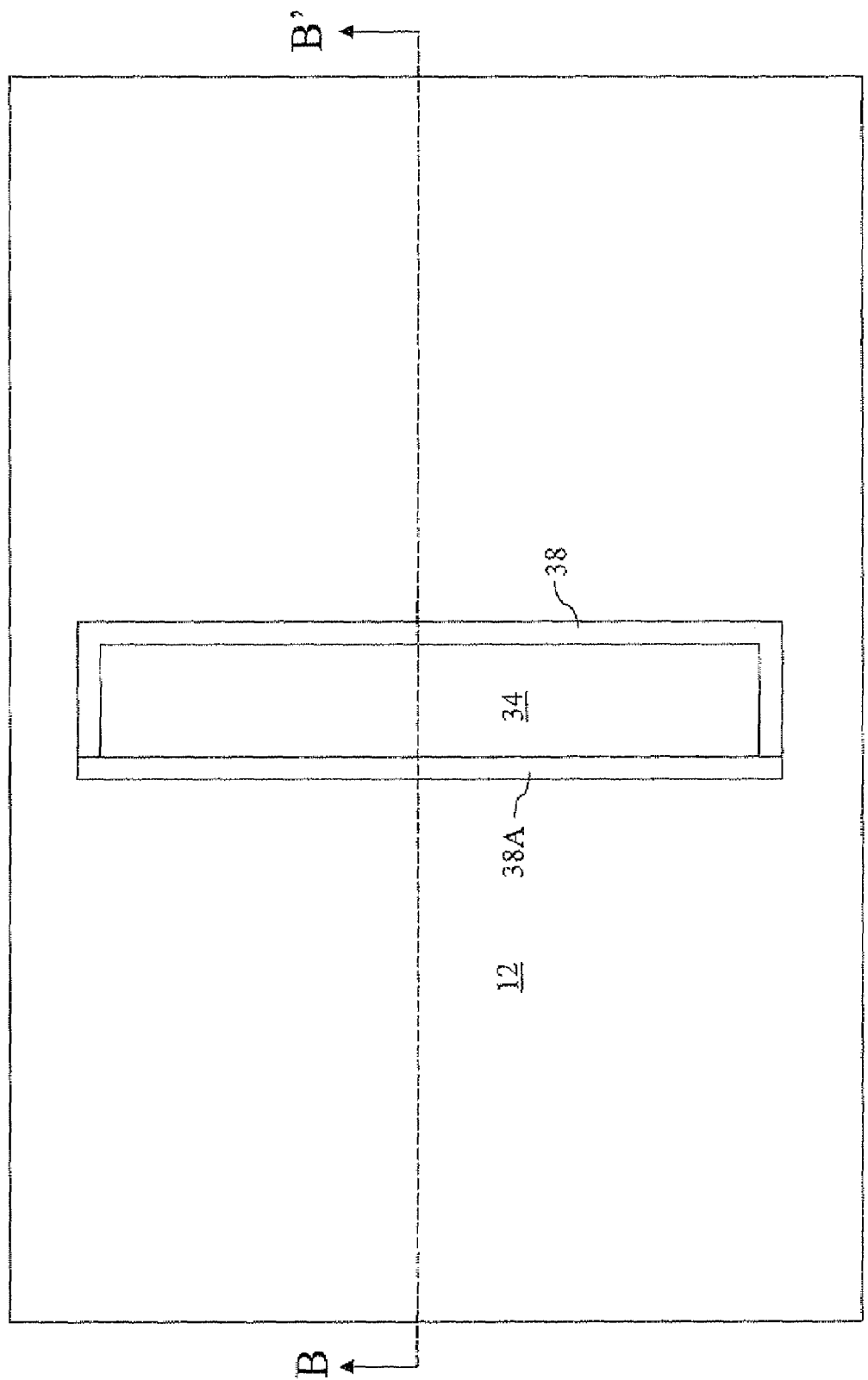
Figure 6B:
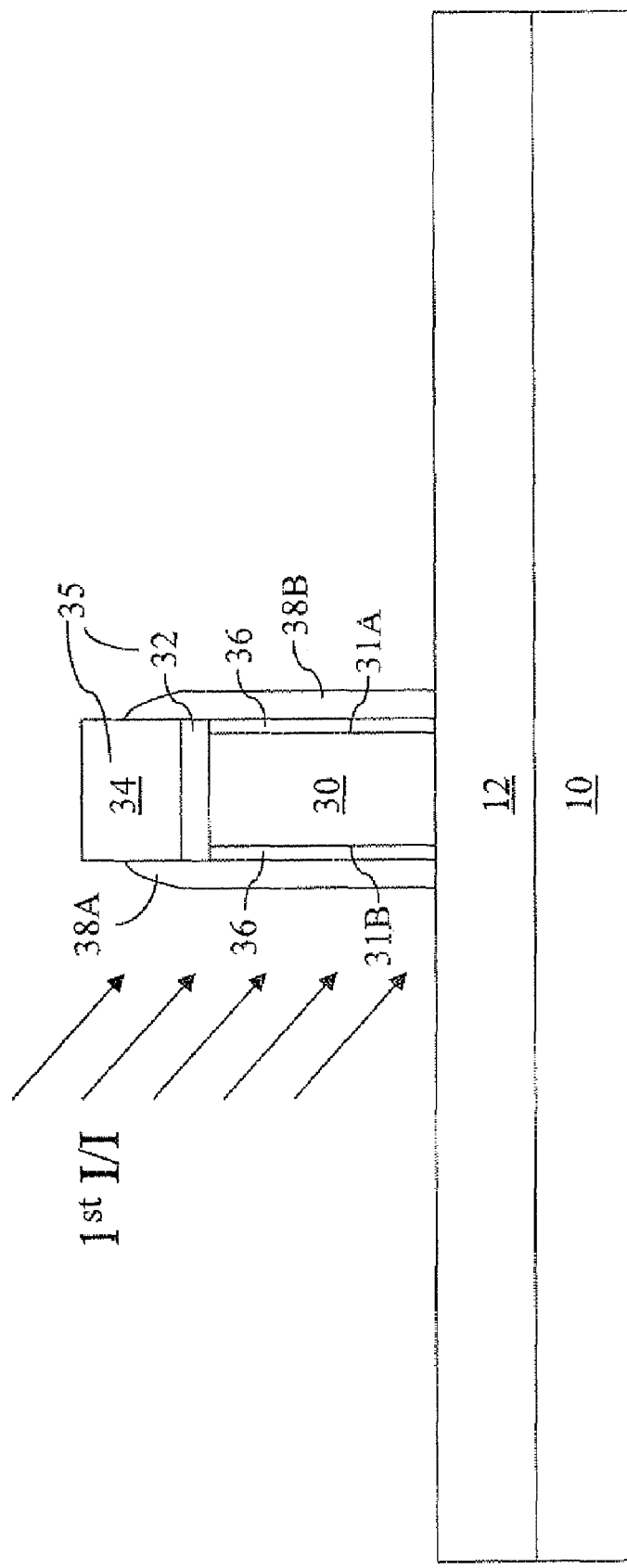

Referring to FIGS. 6A and 6B, an electrical dopant is implanted by a first ion implantation into a first floating gate spacer portion 38A, which is the portion of the floating gate spacer 38 located directly on the second sidewall 31B of the semiconductor fin 30. The remainder of the floating gate spacer 38, which is located on the first sidewall 31A and two end walls of the semiconductor fin 30, constitutes a second floating gate spacer portion 38B. The electrical dopants may comprise B, Ga, In, P, As, and/or Sb. The first ion implantation is an angled ion implantation. The direction of the first ion implantation is shown by a set of arrows labeled $1^{st}$ I/I. The energy of the implanted ions is adjusted so that an insignificant amount of ions are implanted into the semiconductor fin 30, while most of the ions are implanted into the first floating gate spacer portion 38A. The dose of the implanted ions is set to enhance the etch rate of the first floating gate spacer portion 38A over the etch rate of the second floating gate spacer portion 38B at least by a factor of two, preferably at least by a factor of four, and most preferably at least by a factor of eight in at least one etch chemistry.

The first floating gate spacer portion 38A is etched selective to the second floating gate spacer portion 38B. The entire first floating gate spacer portion 38A is etched, while an insignificant portion of the second floating gate spacer portion 38B is removed. In one embodiment, the first floating gate spacer portion 38A is implanted with As, and a wet etch that provides a higher etch rate for As doped silicon germanium alloy relative to undoped silicon germanium alloy is employed to selectively remove the first floating gate spacer portion 38A, while preserving most of the second floating gate spacer portion 38B. The floating gate dielectric 36 is exposed on the side of the second sidewall 31B of the semiconductor fin 30.

Figure 7A:
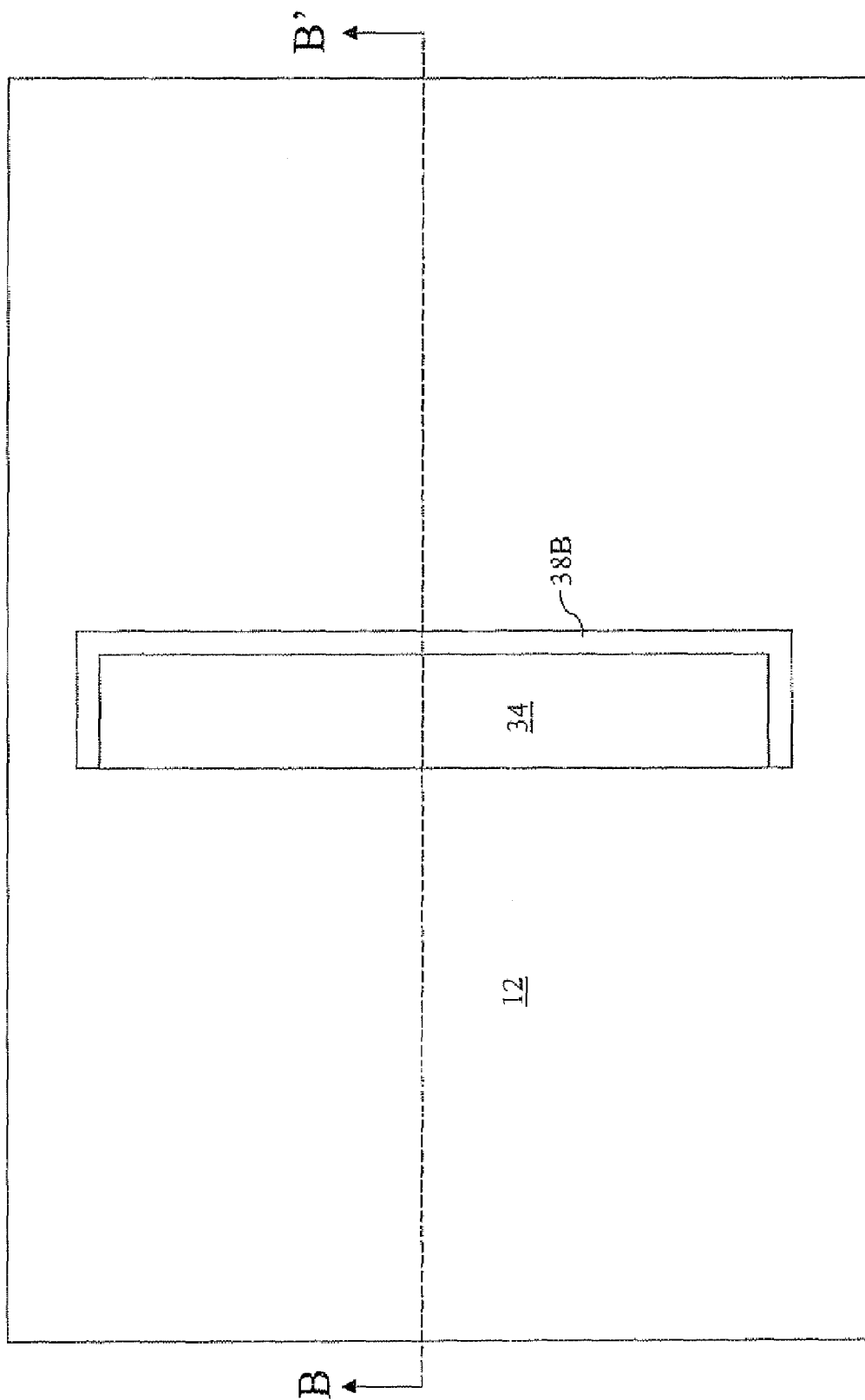
Figure 7B:
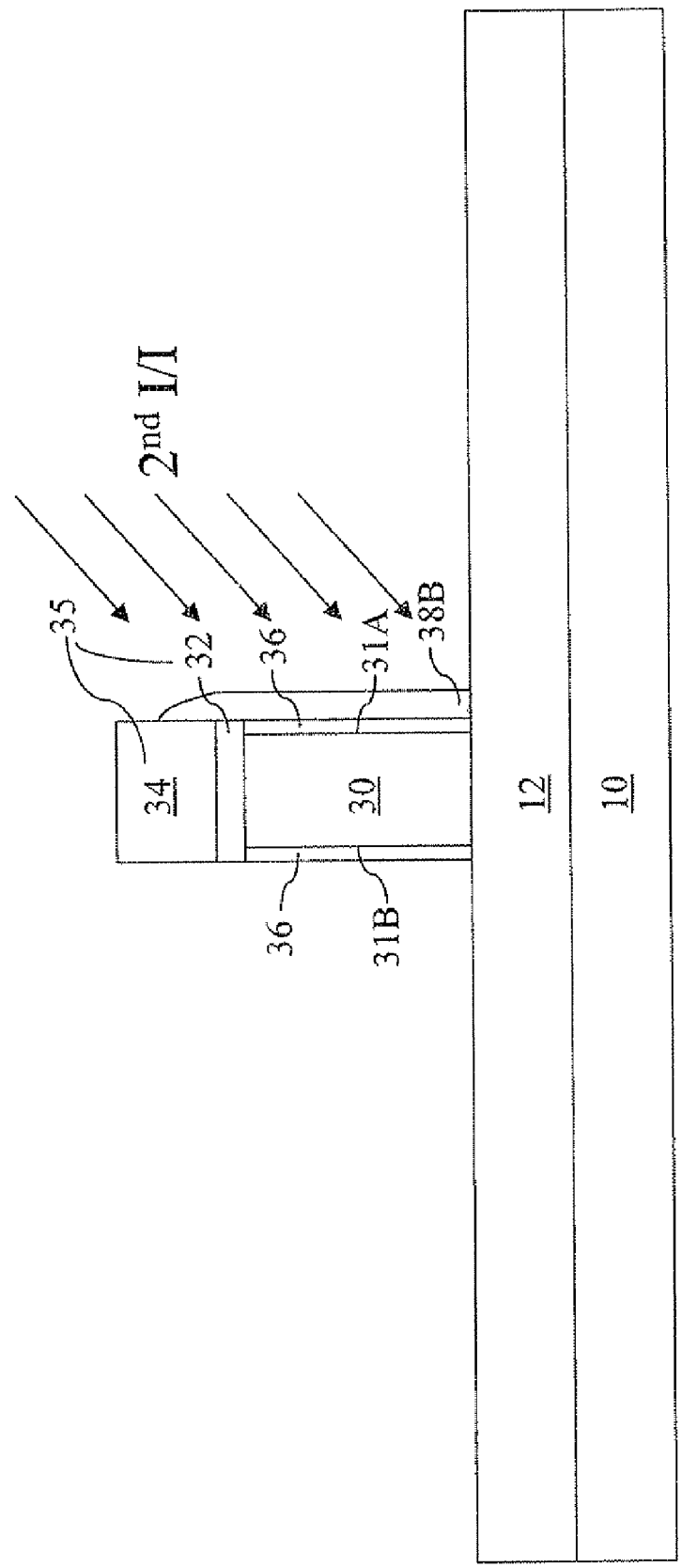

Referring to FIGS. 7A and 7B, dopants of a second conductivity type are implanted into the second floating gate spacer portion 38B by a second ion implantation. The second conductivity type is the opposite of the first conductivity type. The semiconductor fin 30 has a doping of the first conductivity type as the top semiconductor layer 20, the second floating gate spacer portion 38B has the opposite type of doping relative to the semiconductor fin 30. The direction of the second ion implantation is shown by a set of arrows labeled $2^{nd}$ I/I. The energy of the implanted ions is adjusted so that an insignificant amount of ions are implanted into the semiconductor fin 30, while most of the ions are implanted into the second floating gate spacer portion 38B. The dose of the implanted ions is determined by a target doping concentration of the second floating gate spacer portion 38B, which is typically from about $1.0 \times 10^{19}/cm^3$ to about $3.0 \times 10^{21}/cm^3$ in atomic concentration.

Figure 8A:
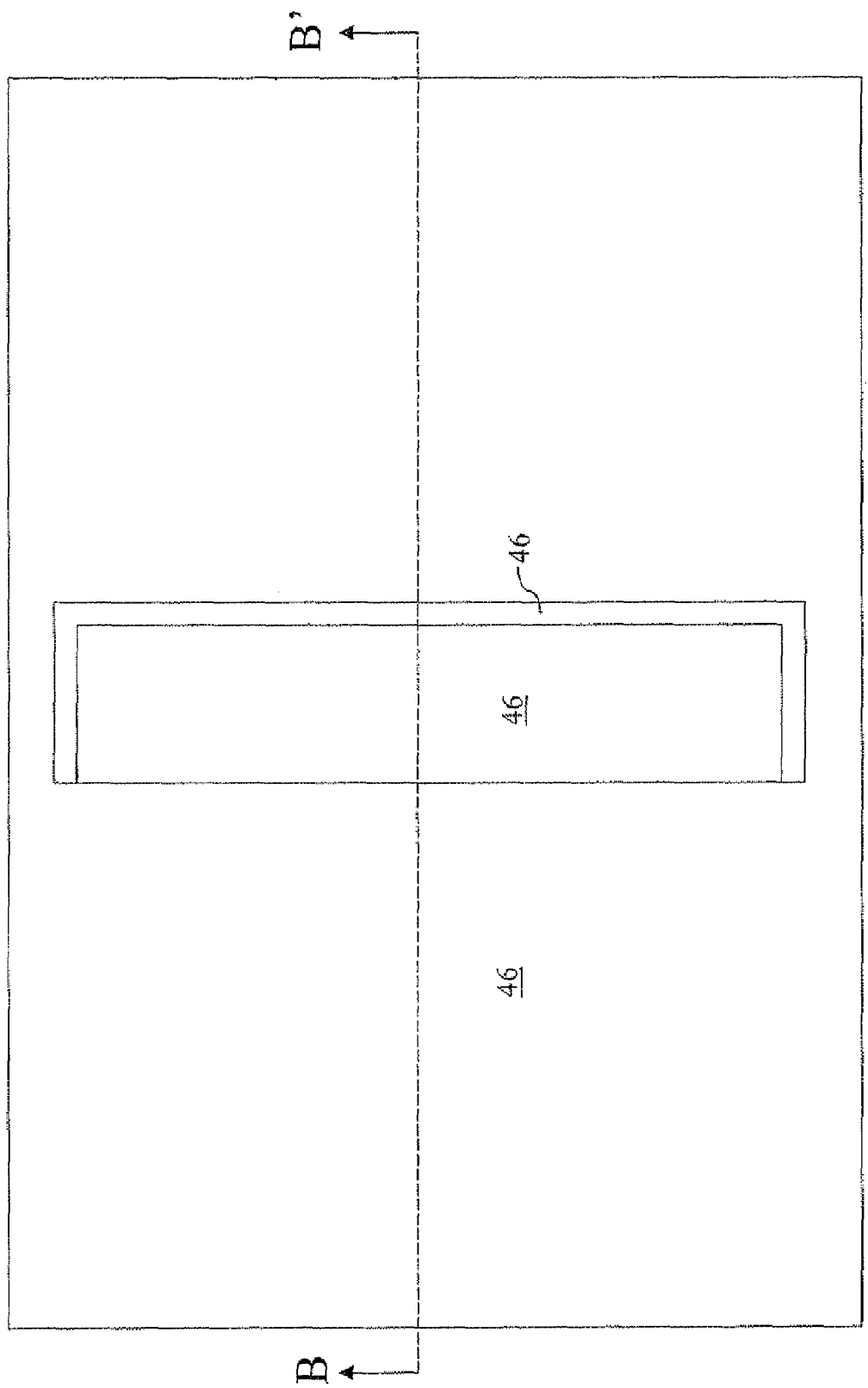
Figure 8B:
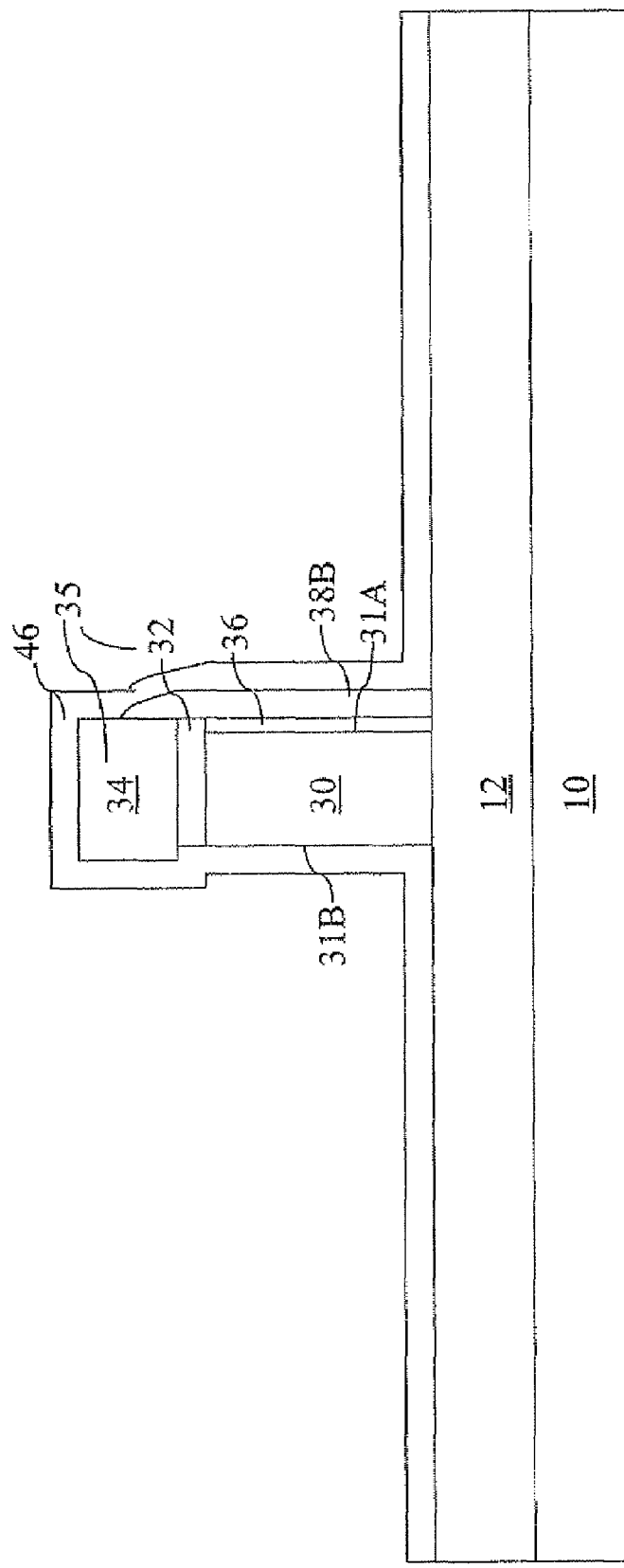

Referring to FIGS. 8A and 8B, a control gate dielectric layer 46 is formed on the second sidewall 31B of the semiconductor fin 30, the at least one fin cap dielectric portion 35, the second floating gate spacer portion 38B, and the buried insulator layer 12. Preferably, the control gate dielectric layer 46 comprises a high-k dielectric material having a dielectric constant greater than 3.9. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, an alloy thereof, and a silicate thereof. Deposition methods for high-k dielectric materials described above may be employed to form the control gate dielectric layer 46. The control gate dielectric layer 46 has an equivalent oxide thickness (EOT), which is herein referred to as a "control gate dielectric EOT," and optimized for performance of a finFET. The control gate dielectric EOT may be different from the floating gate dielectric EOT. Since the second floating gate spacer portion 38B protrudes out from the side of the first sidewall 31A of the semiconductor fin 30, the control gate dielectric layer 46 has a bump on the side of the first sidewall 31A of the semiconductor fin 30.

Figure 9A:
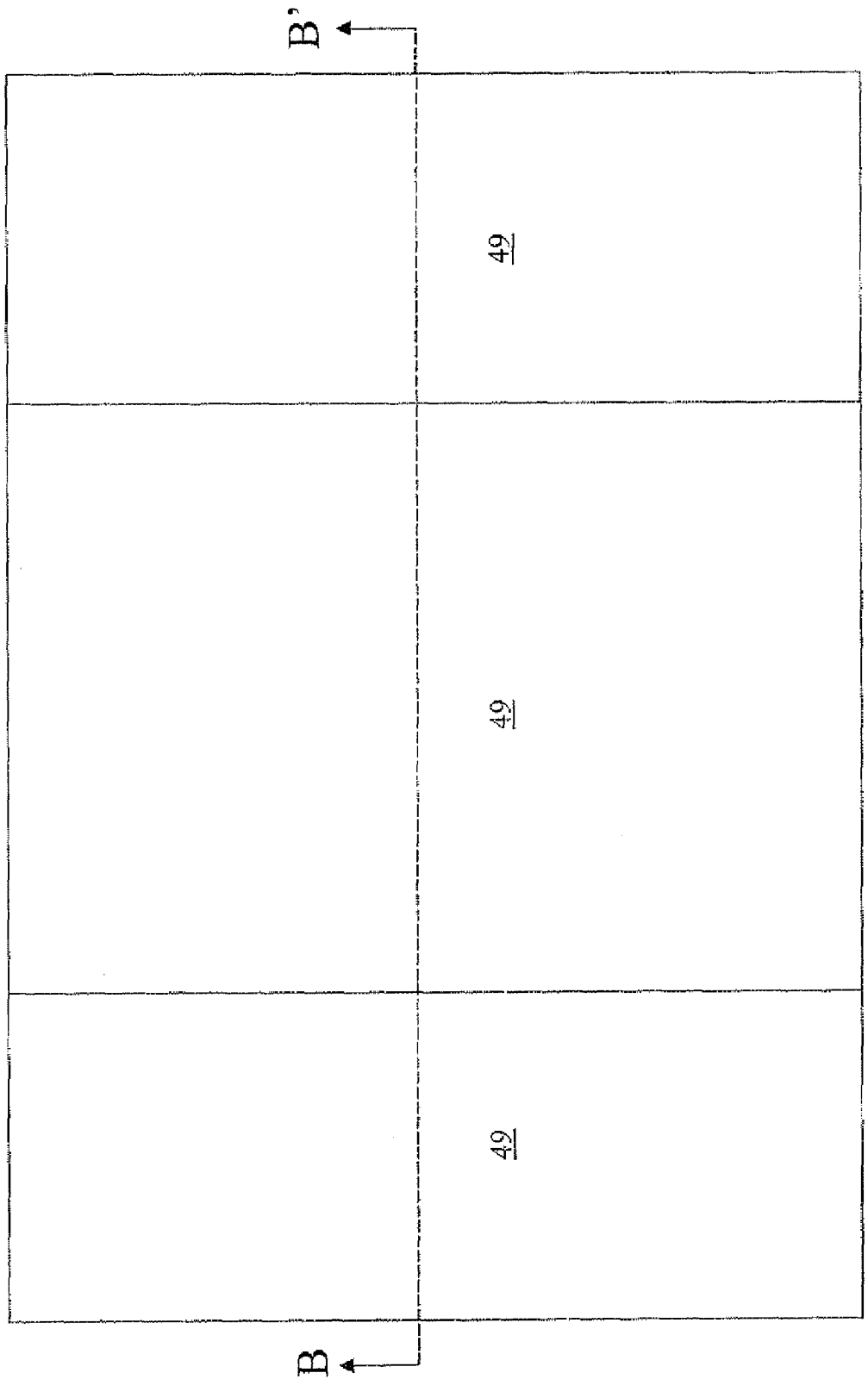
Figure 9B:
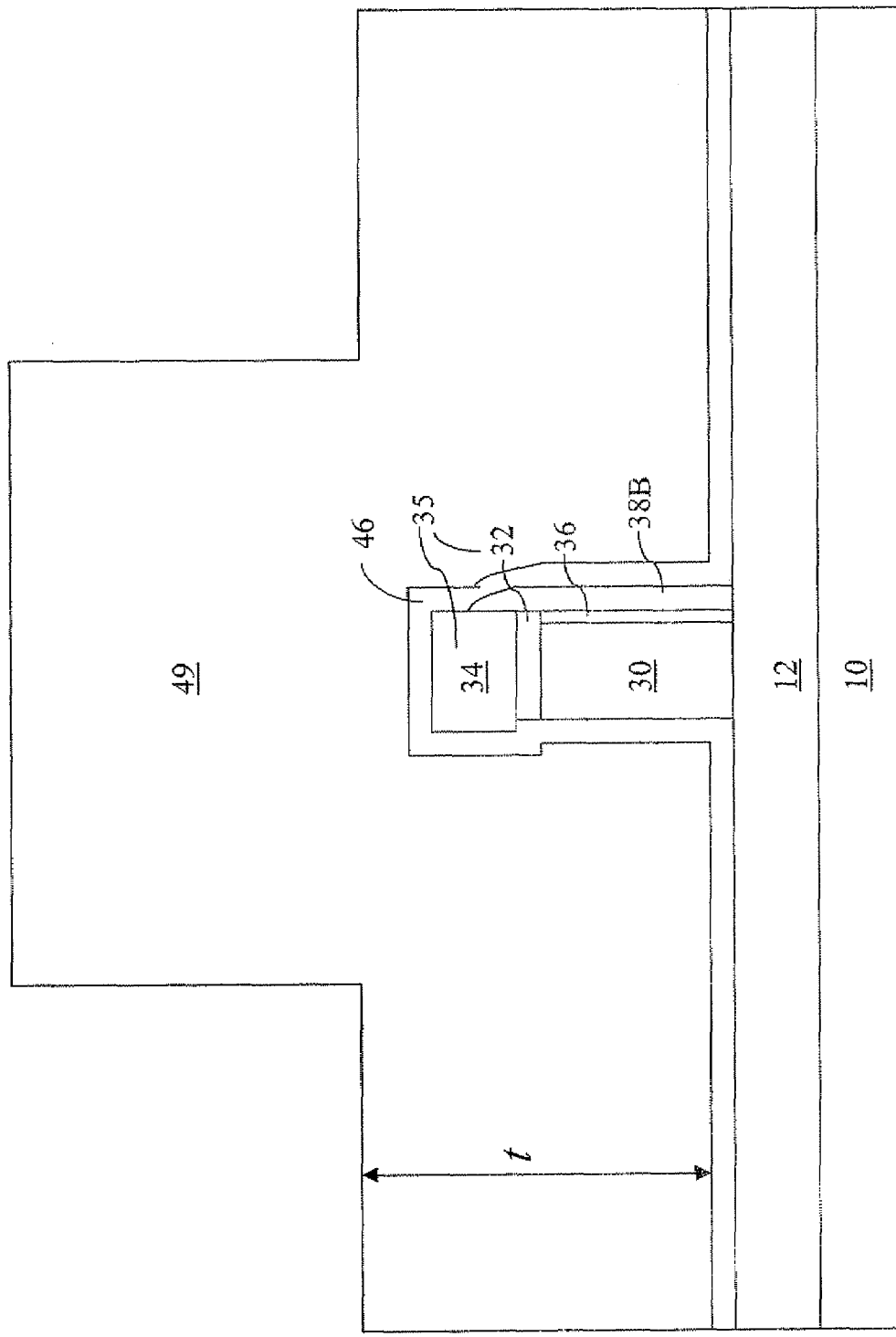

Referring to FIGS. 9A and 9B, a gate conductor layer 49 is formed on the control gate dielectric layer 46, for example, by blanket deposition. The gate conductor layer 49 may comprise a semiconductor material such as silicon, germanium, gallium arsenide, other compound semiconductors, and/or an alloy thereof. In an exemplary embodiment, the gate conductor layer 49 comprises polysilicon. The gate conductor layer 49 may be in-situ doped, or alternatively, deposited as an undoped material and doped by ion implantation of dopants. Multiple ion implantation steps may be employed with patterned block masks to dope different portions of the gate conductor layer 49 with different doping conductivity type and/or different doping concentration. The thickness t of the gate conductor layer 49 is greater than the sum of the height of the semiconductor fin 30 and the height of the at least one fin cap dielectric portion 35.

Figure 10A:
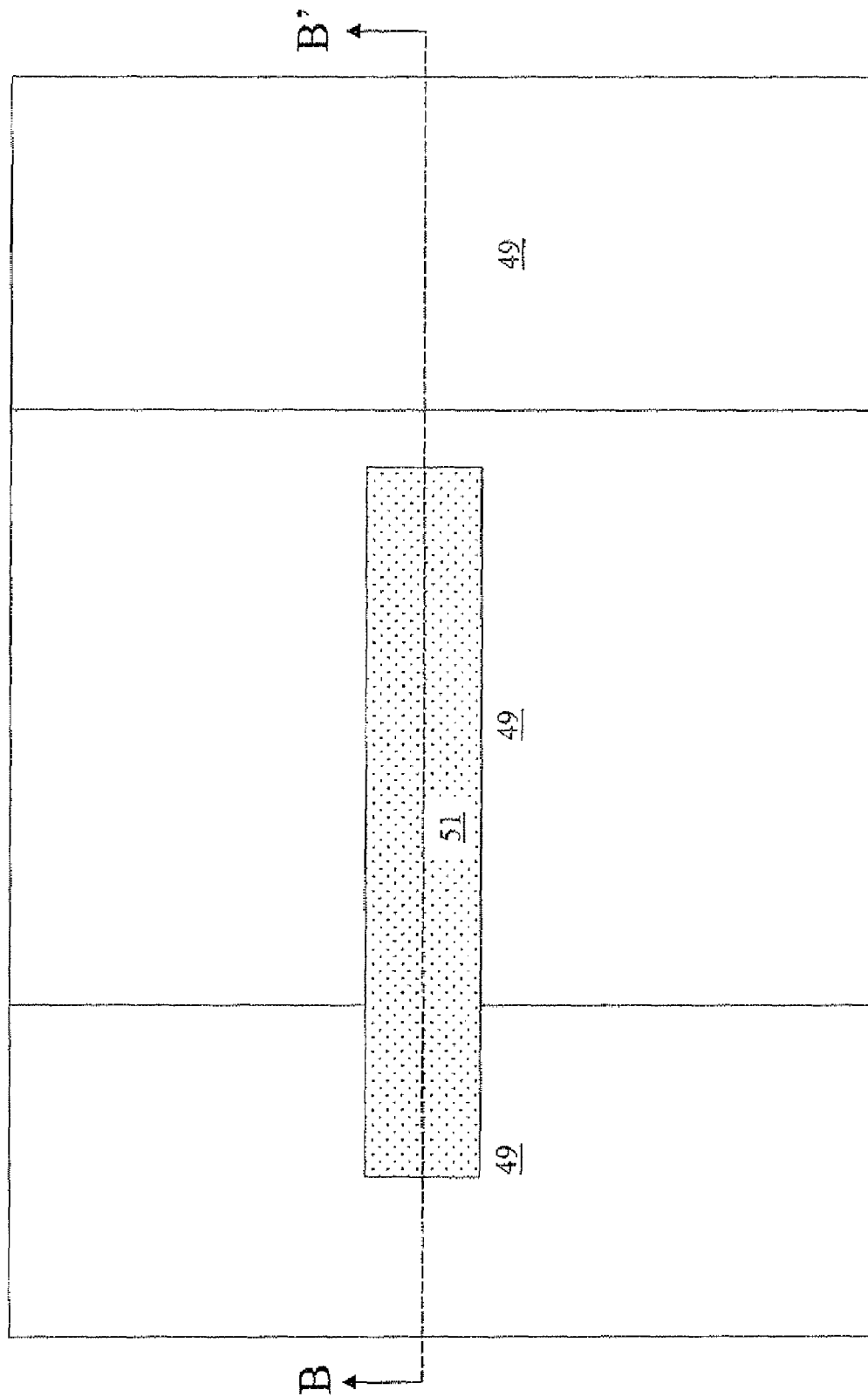
Figure 10B:
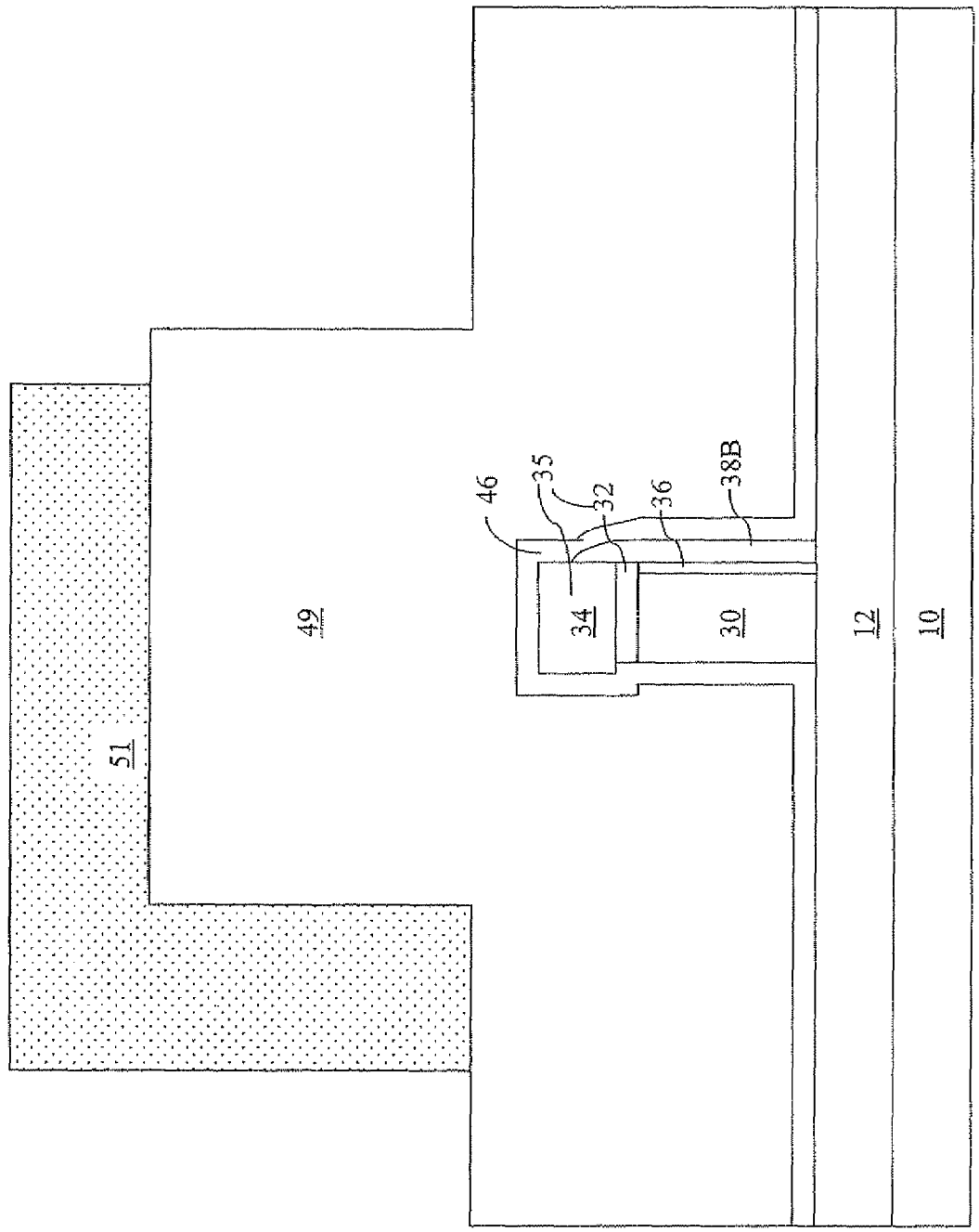

Referring to FIGS. 10A and 10B, a second photoresist 51 is applied to the gate conductor layer 49 and lithographically patterned in the shape of a gate electrode as seen in a top-down view.

Figure 11A:
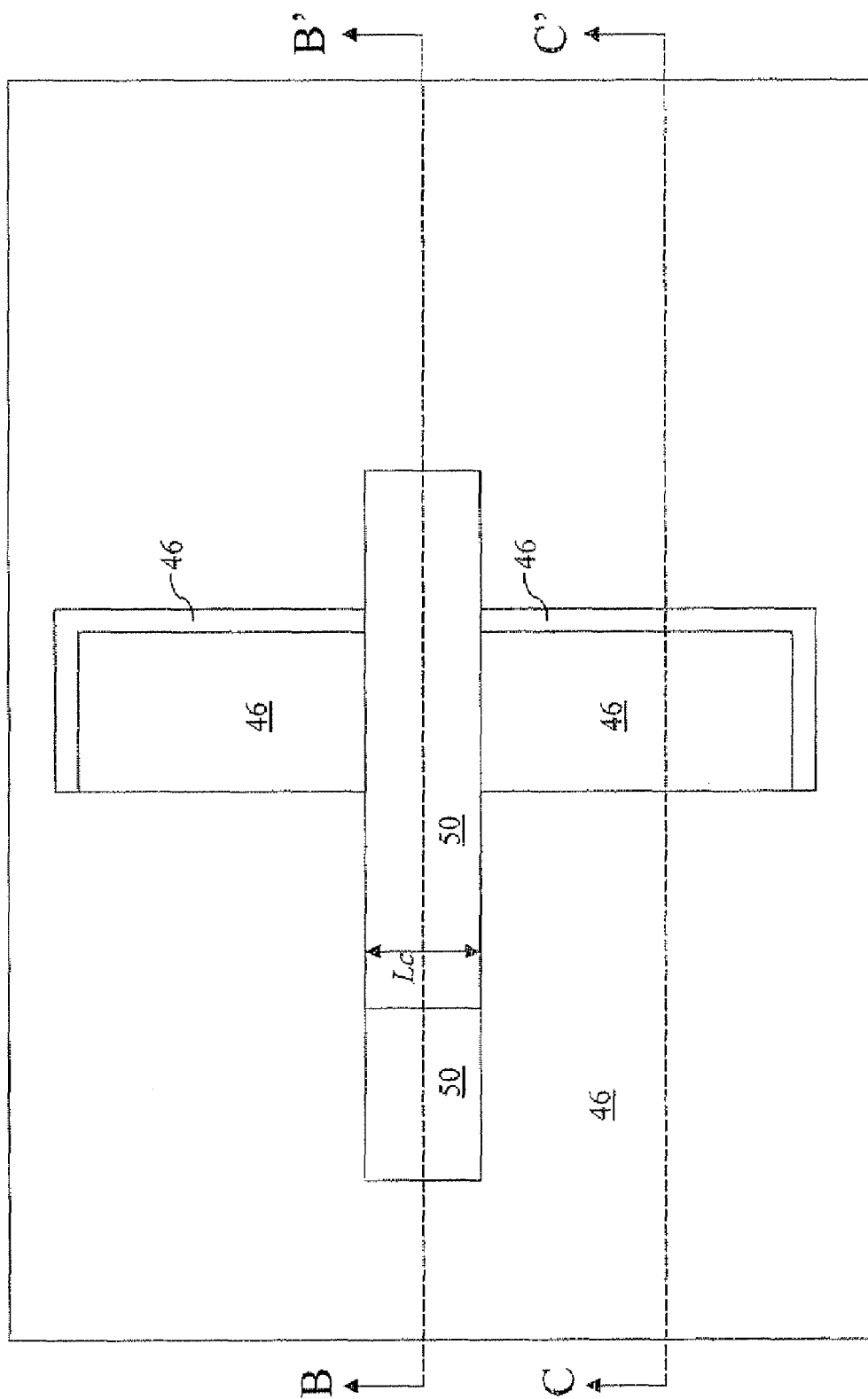
Figure 11B:
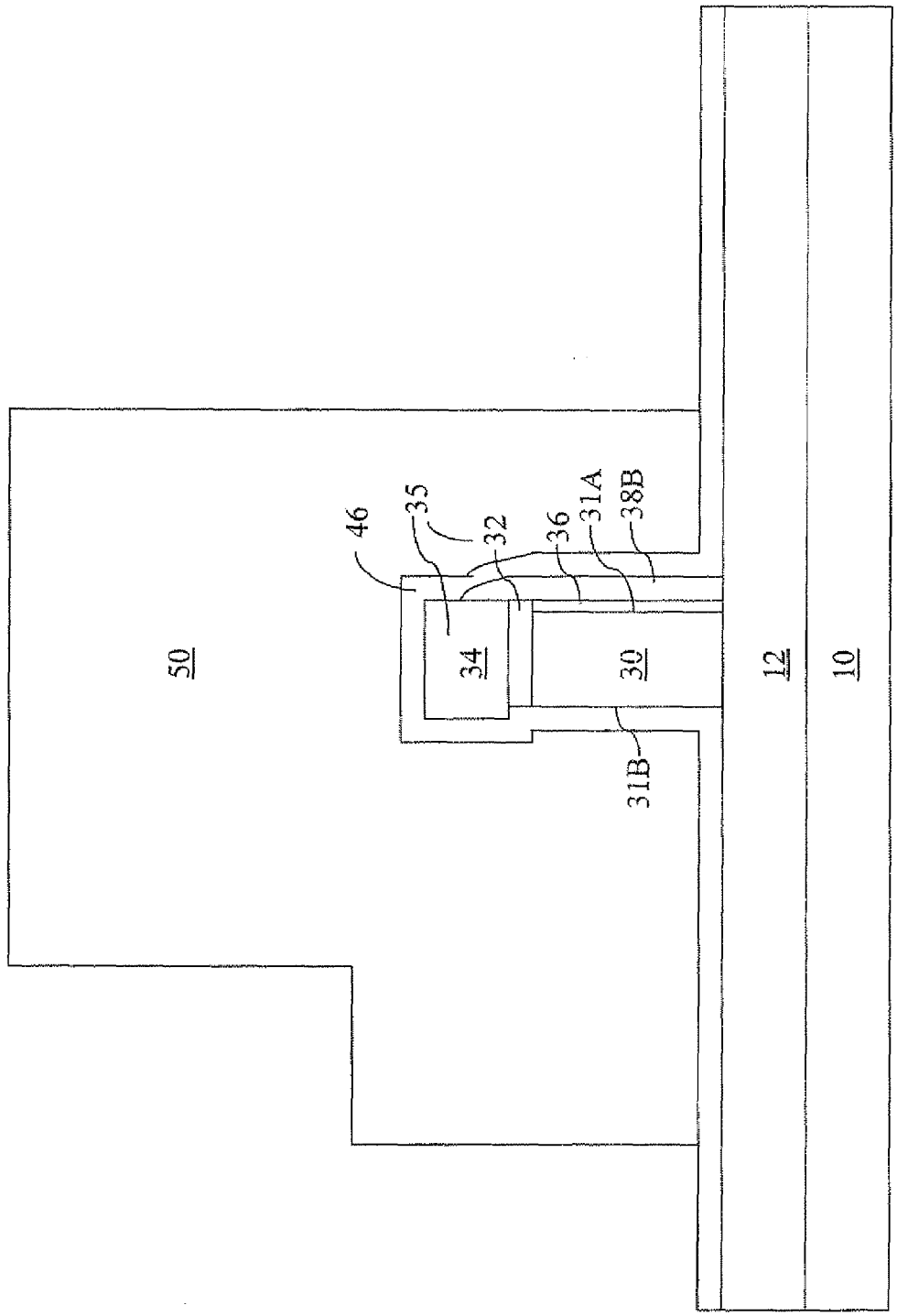

Referring to FIGS. 11A-11C, the gate conductor layer 49 is etched by an anisotropic reactive ion etch employing the second photoresist 51 as an etch mask to form a control gate 50. The control gate dielectric layer 46 may be employed as a stopping layer of the anisotropic reactive ion etch. As seen in a top-down view, the control gate 50 intersects the semiconductor fin 40. The second photoresist 51 is thereafter removed.

Preferably, the dimension of the control gate 50 in a lengthwise direction of the semiconductor fin 30, i.e., a horizontal direction contained in the plane of the first sidewall 31A and the second sidewall 31B of the semiconductor fin 30, is substantially constant within the control gate, and is herein referred to as a control gate length Lc. The control gate length Lc is lithographically controlled, and may be a lithographic minimum dimension, or a "critical dimension." Methods of reducing the control gate length Lc below the lithographic minimum dimension by a trimming etch is known in the art.

Referring to FIGS. 12A-12D, a gate spacer 52 is formed around the control gate 50 by a conformal deposition of a gate spacer layer (not shown) followed by an anisotropic reactive ion etch. The gate spacer 52 comprises a dielectric material such as silicon oxide and/or silicon nitride. In one embodiment, the gate spacer 52 comprises silicon nitride.

Figure 12A:
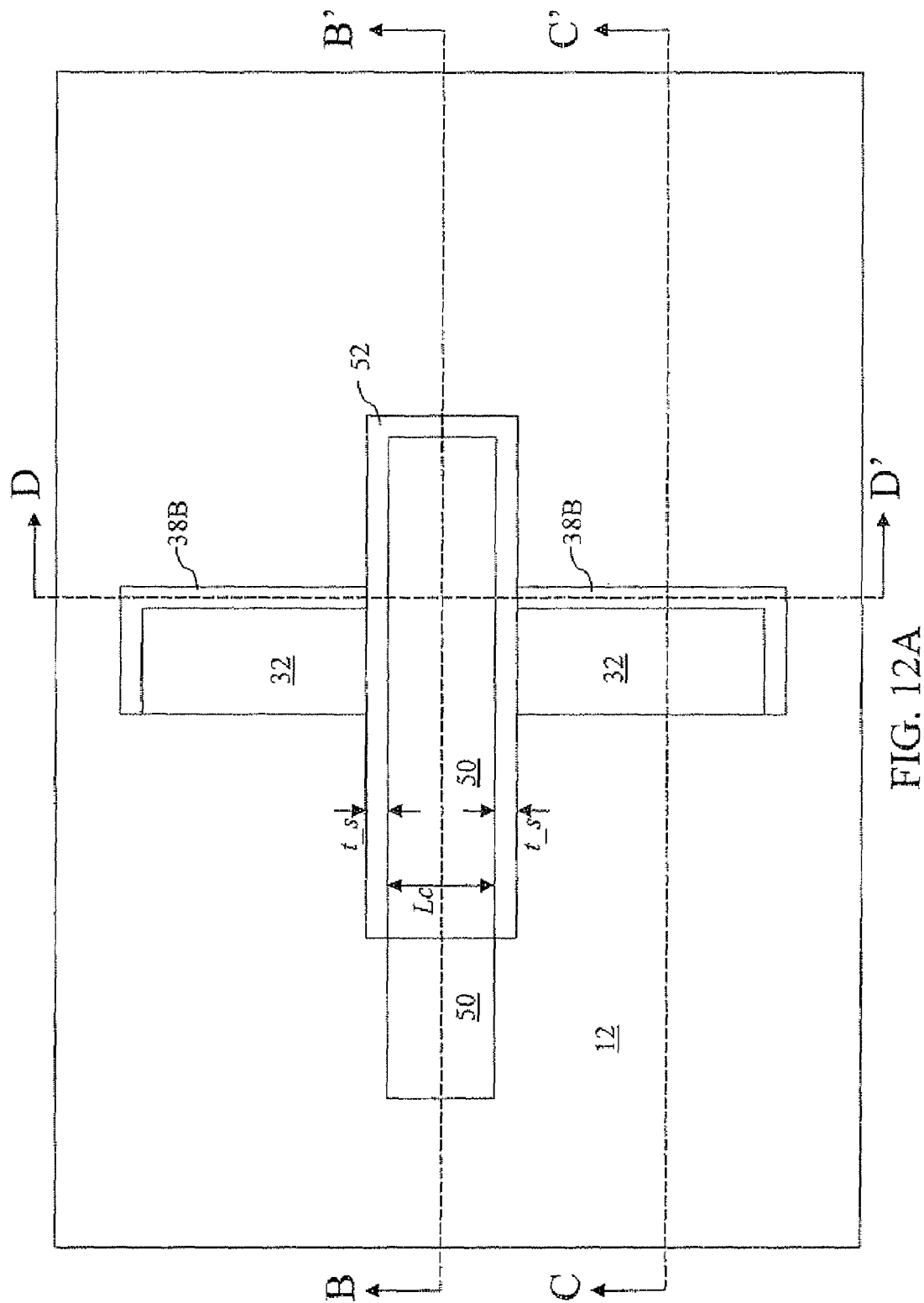
Figure 12B:
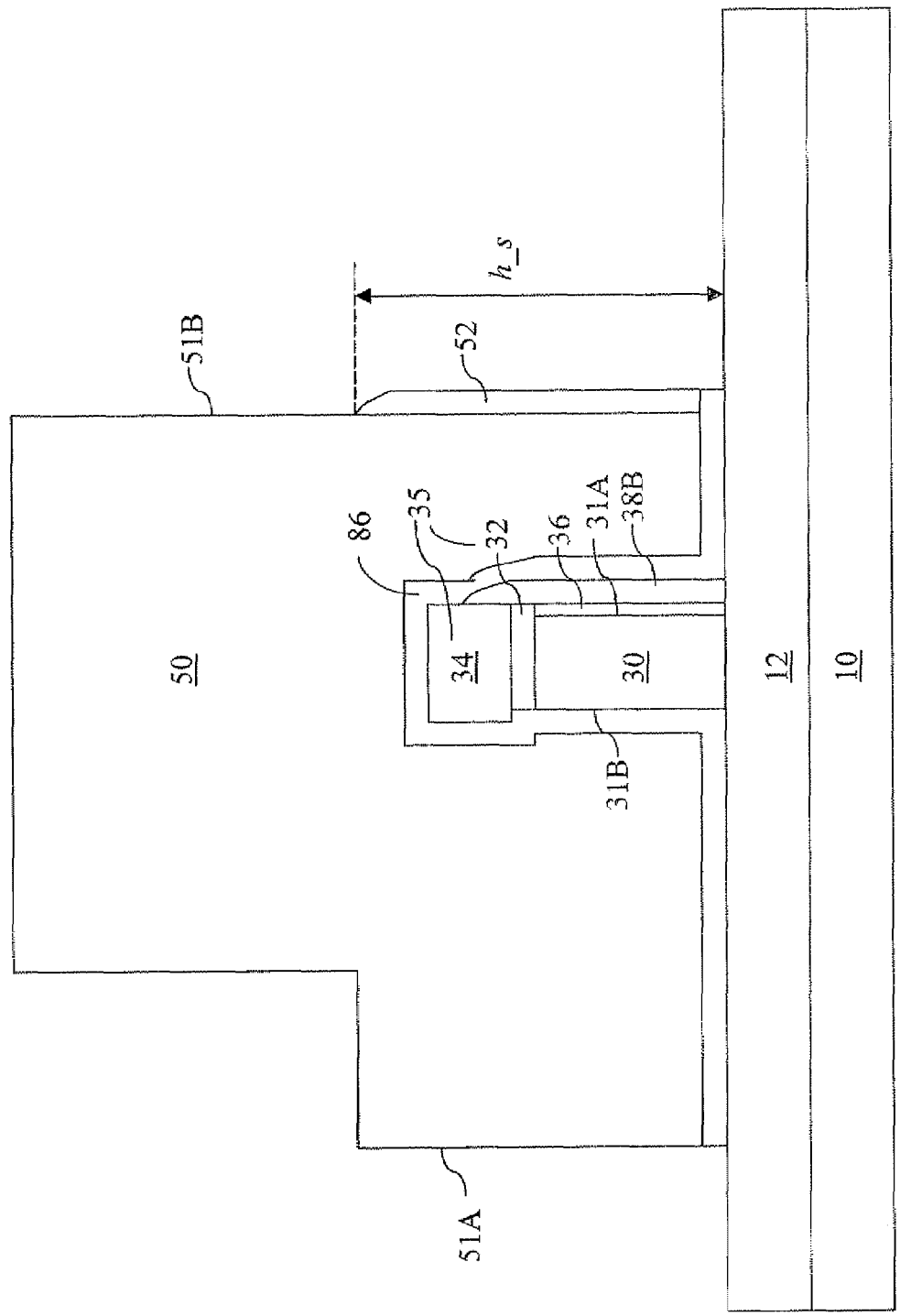
Figure 12C:
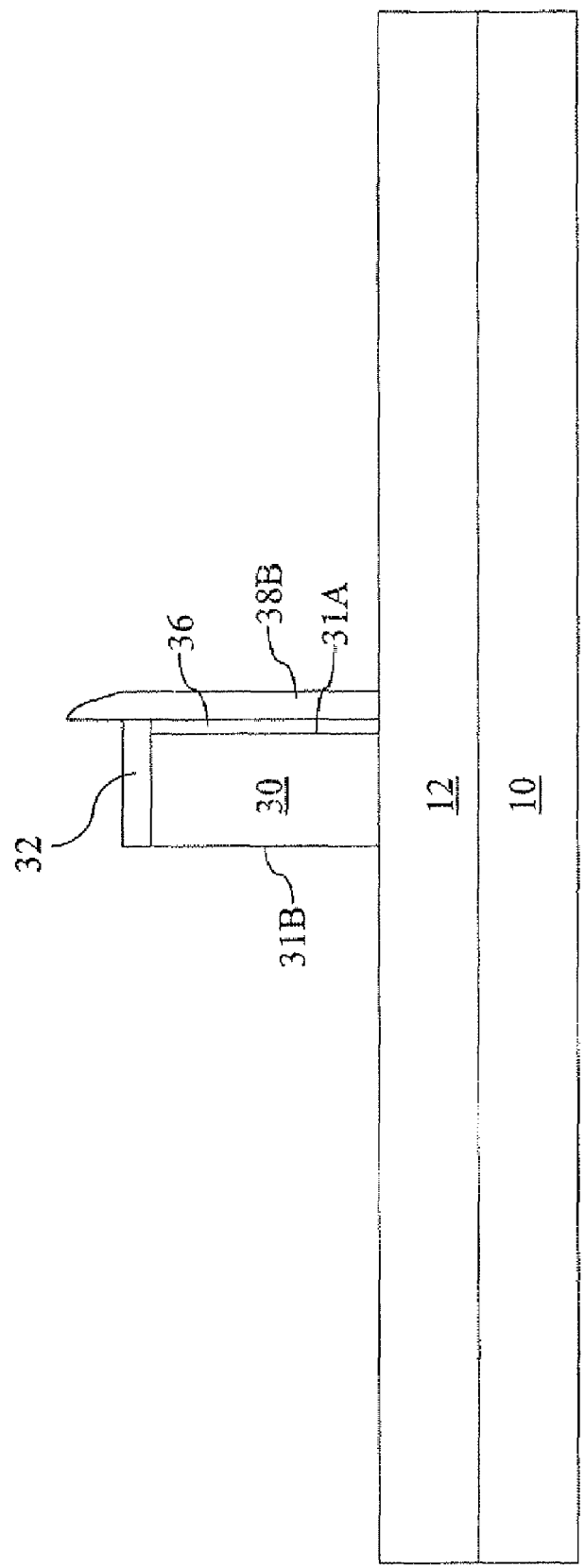
Figure 12D:
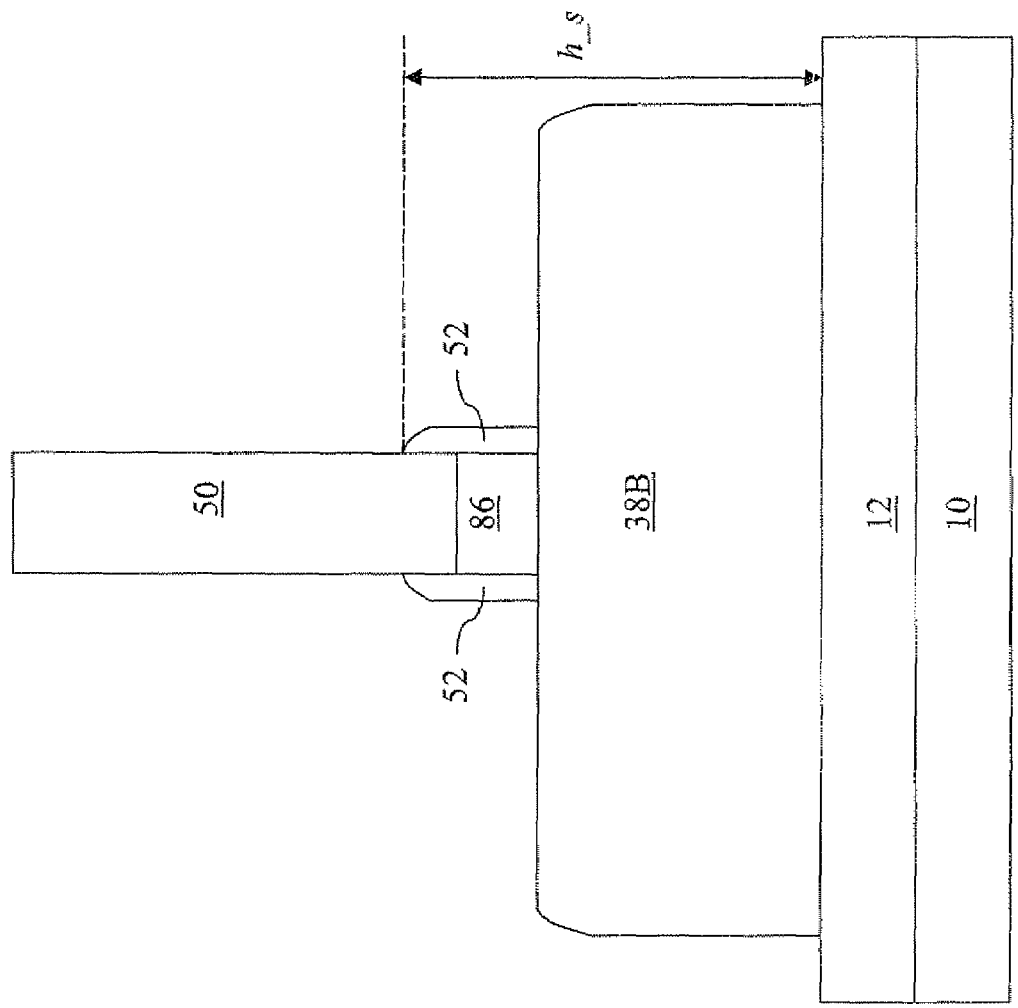

The thickness $t\_s$ of the gate spacer 52 may be from about 2.5 nm to about 60 nm, and typically from about 5 nm to about 30 nm. Depending on the distances of a first end wall 51A and a second end wall 51B from the semiconductor fin 30, the gate spacer 52 may be located on three sides of the control gate 50 as shown in FIG. 12A, on four sides of the control gate 50, or on two sides of the control gate 50.

The height $h\_s$ of the gate spacer 52 is greater than the sum of the height of the semiconductor fin 30, the height of the at least one fin cap dielectric portion 35, and the thickness of the control gate dielectric 86. Thus, the portion of the control gate dielectric layer 46 overlapping with the control gate 50 and the gate spacer 52 is protected from the anisotropic reactive ion etch. However, the portion of the control gate dielectric layer 46 overlapping with the control gate 50 and the gate spacer 52 is exposed at the end of the anisotropic reactive ion etch.

The exposed portions of the control gate dielectric layer 46 is removed, for example, by a wet etch or a substantially isotropic reactive ion etch. The remaining portion of the control gate dielectric layer 46 constitutes a control gate dielectric 86. The control gate dielectric 86 abuts the buried insulator layer 12, the control gate 50, the second sidewall 31B of the semiconductor fin 30, an outside wall of the second floating gate spacer portion 38B, and the at least one fin cap dielectric portion 35.

Some exposed portions of the at least one fin cap dielectric portion 35 may be removed during the anisotropic reactive ion etch. In one embodiment, the at least one fin cap dielectric portion 35 comprises a first fin cap dielectric portion 32 containing silicon oxide and a second fin cap dielectric portion 34 containing silicon nitride. Exposed portions of the second fin cap dielectric portion 34 containing silicon nitride outside the area of the control gate 50 and the gate spacer 52 in the top down view of FIG. 12A are removed. Preferably, the anisotropic reactive ion etch is selective to silicon oxide, exposing, but not etching, the first fin cap dielectric portion 32 containing silicon oxide outside the area of the control gate 50 and the gate spacer 52 in the top down view. Thus, the size of the at least one fin cap dielectric portion 35 is reduced. The second floating gate spacer portion 38B is exposed outside the area of the control gate 50 and the gate spacer 52 in the top down view.

Figure 13A:
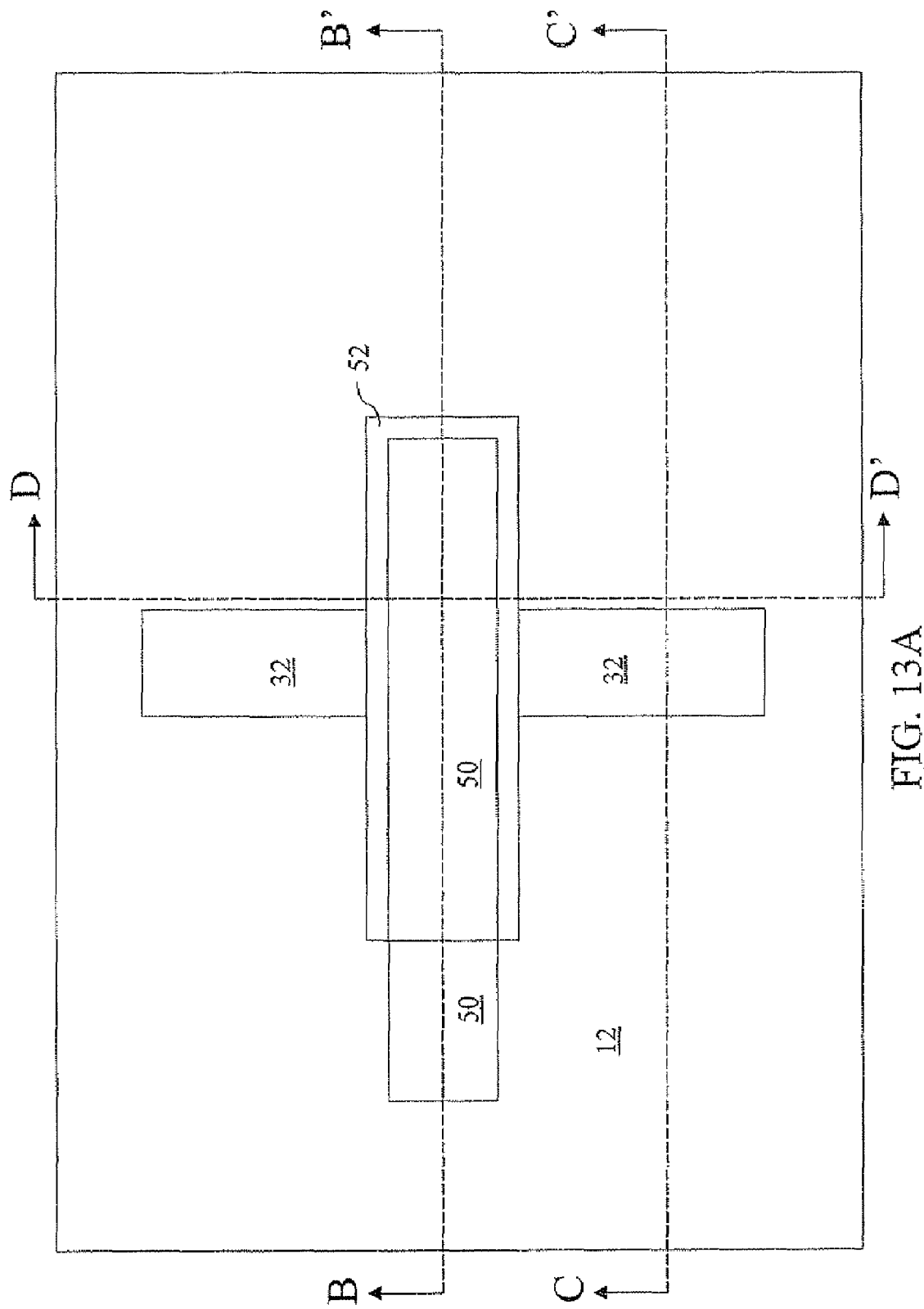
Figure 13B:
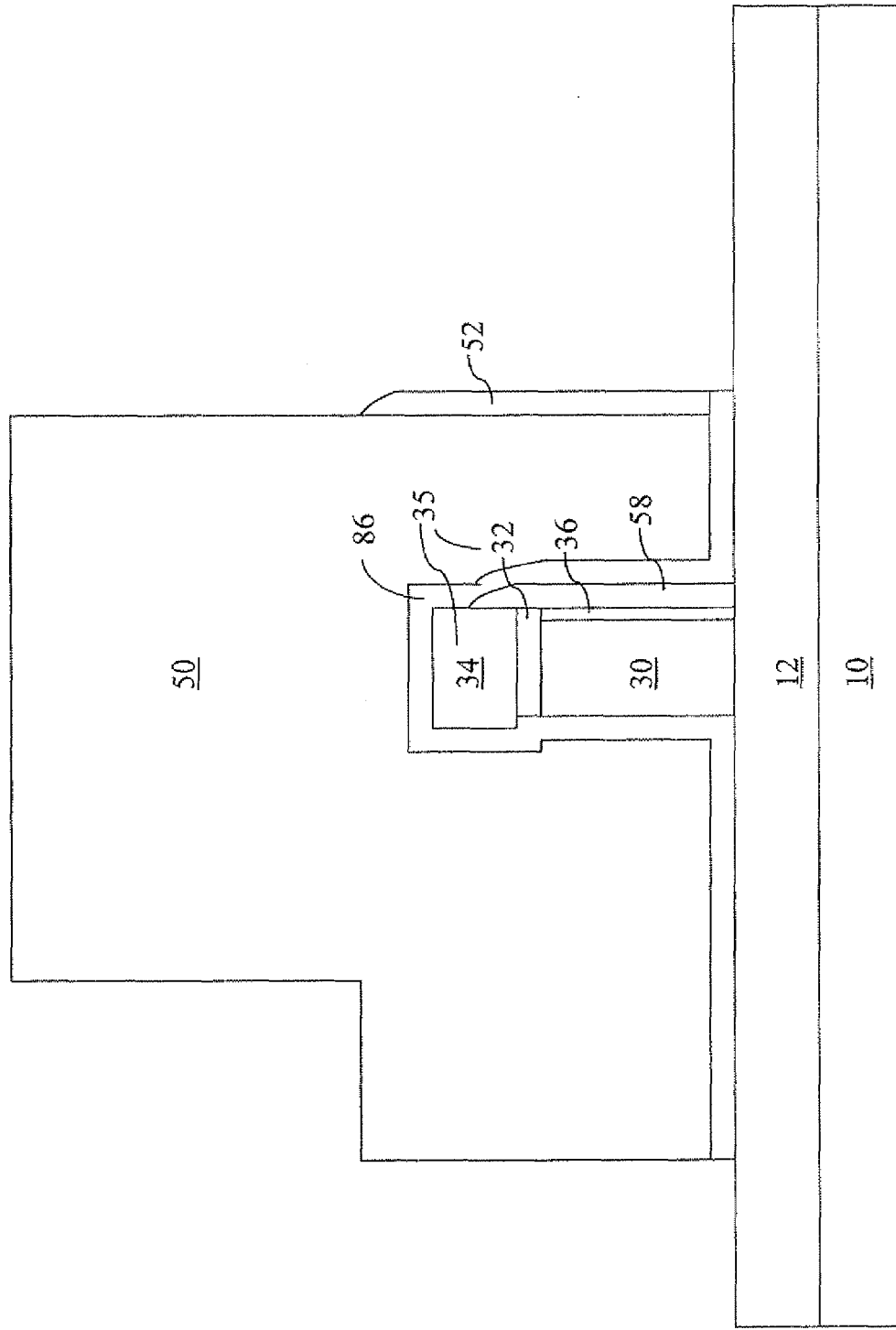
Figure 13C:
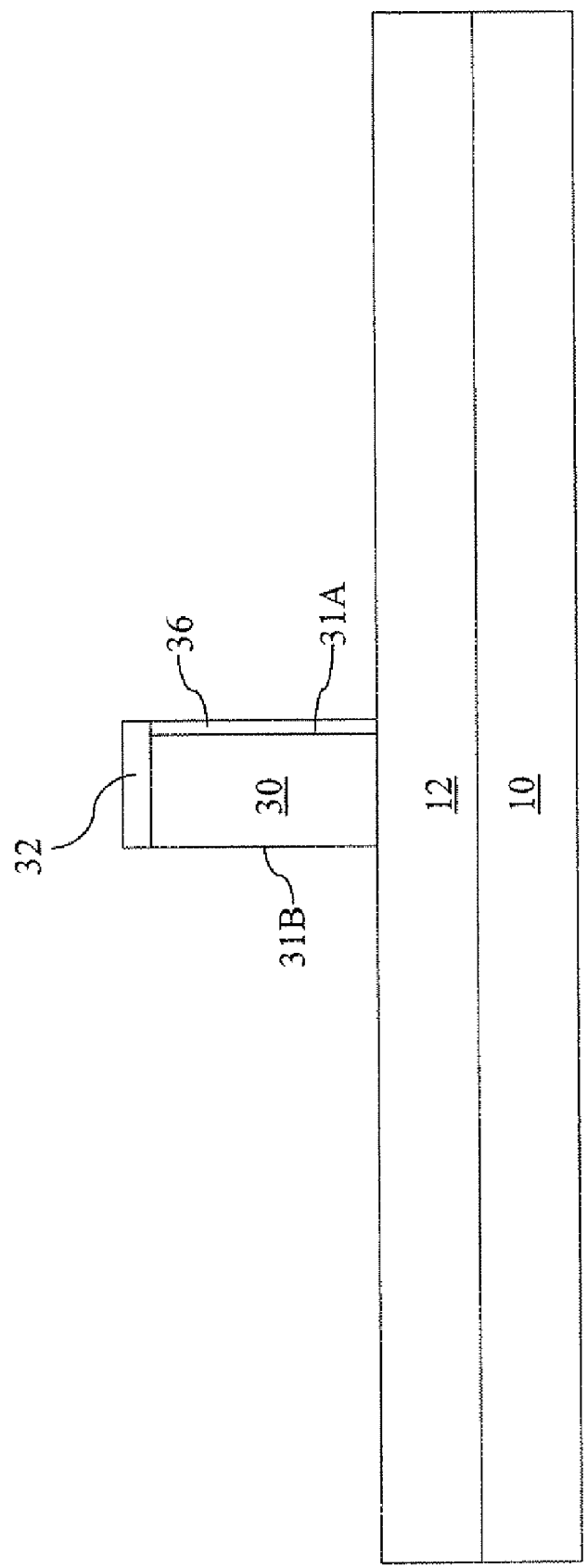
Figure 14A:
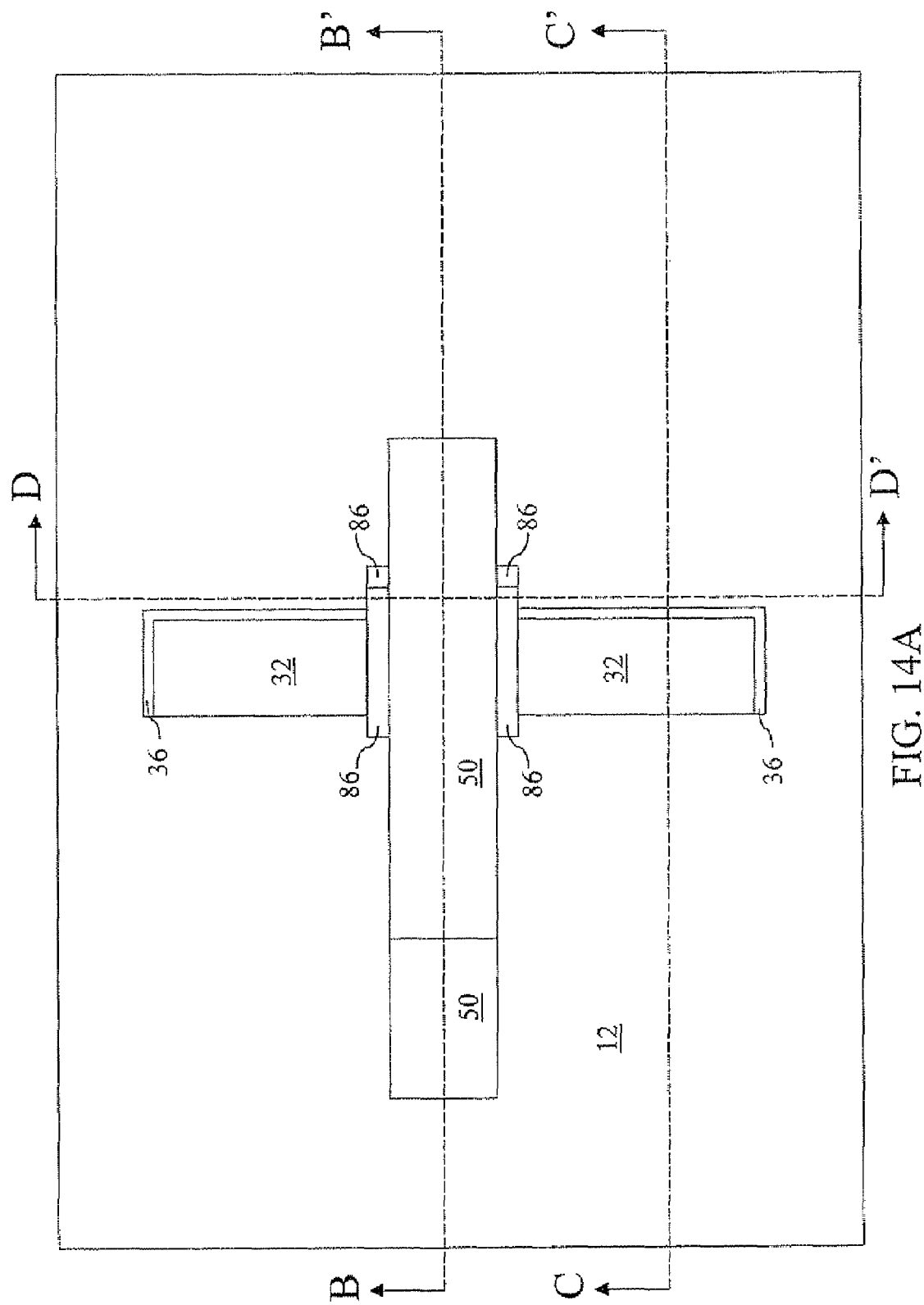
Figure 14B:
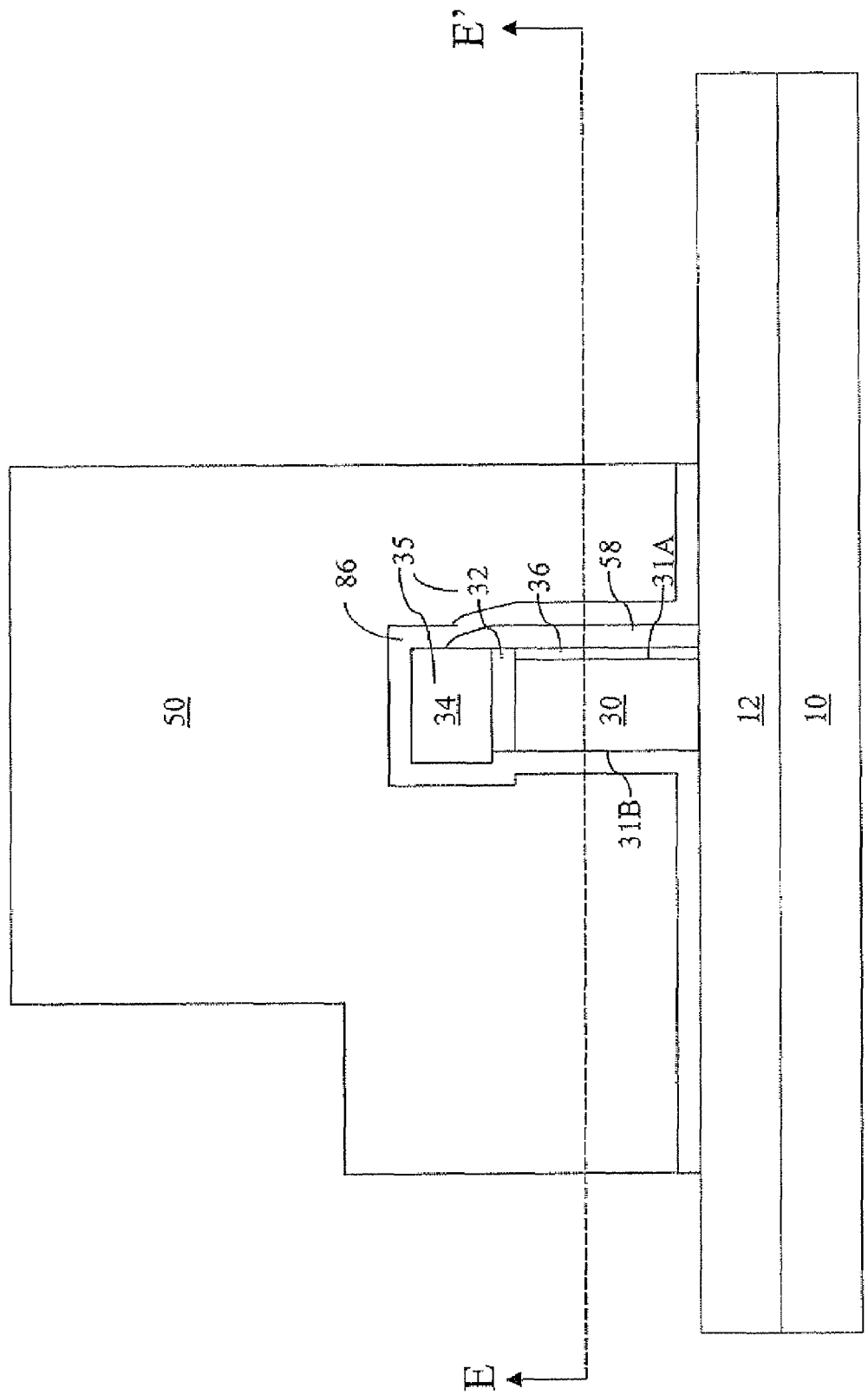
Figure 14C:
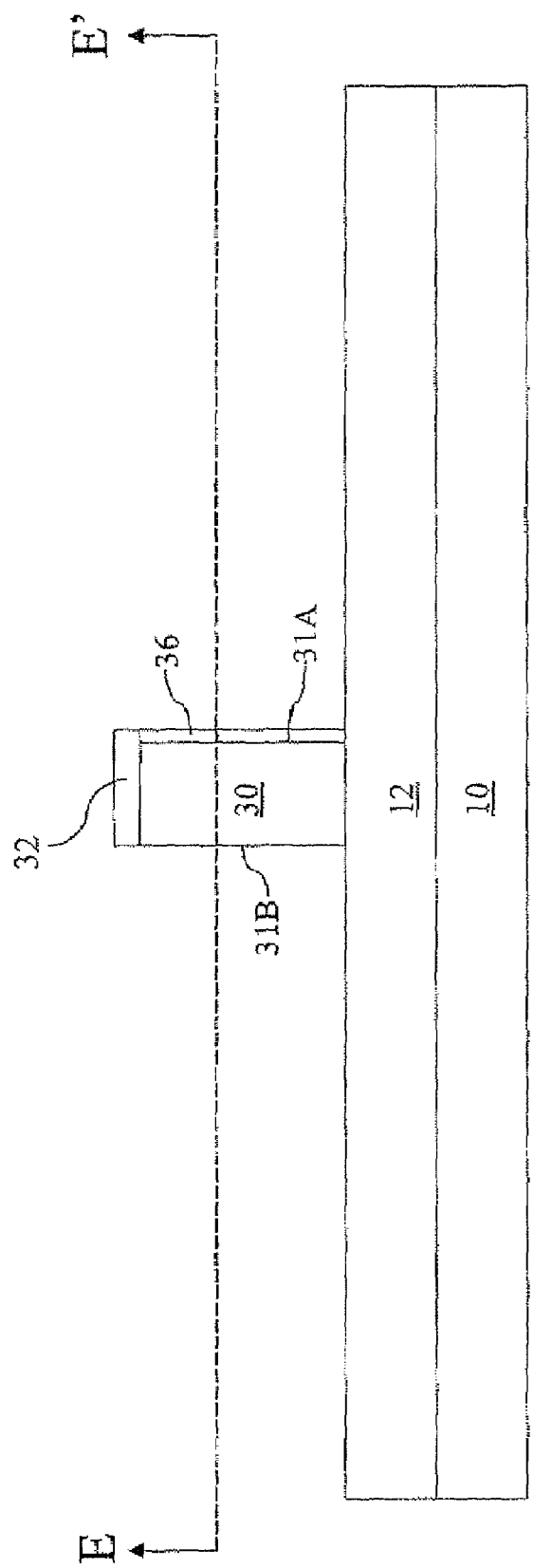
Figure 14D:
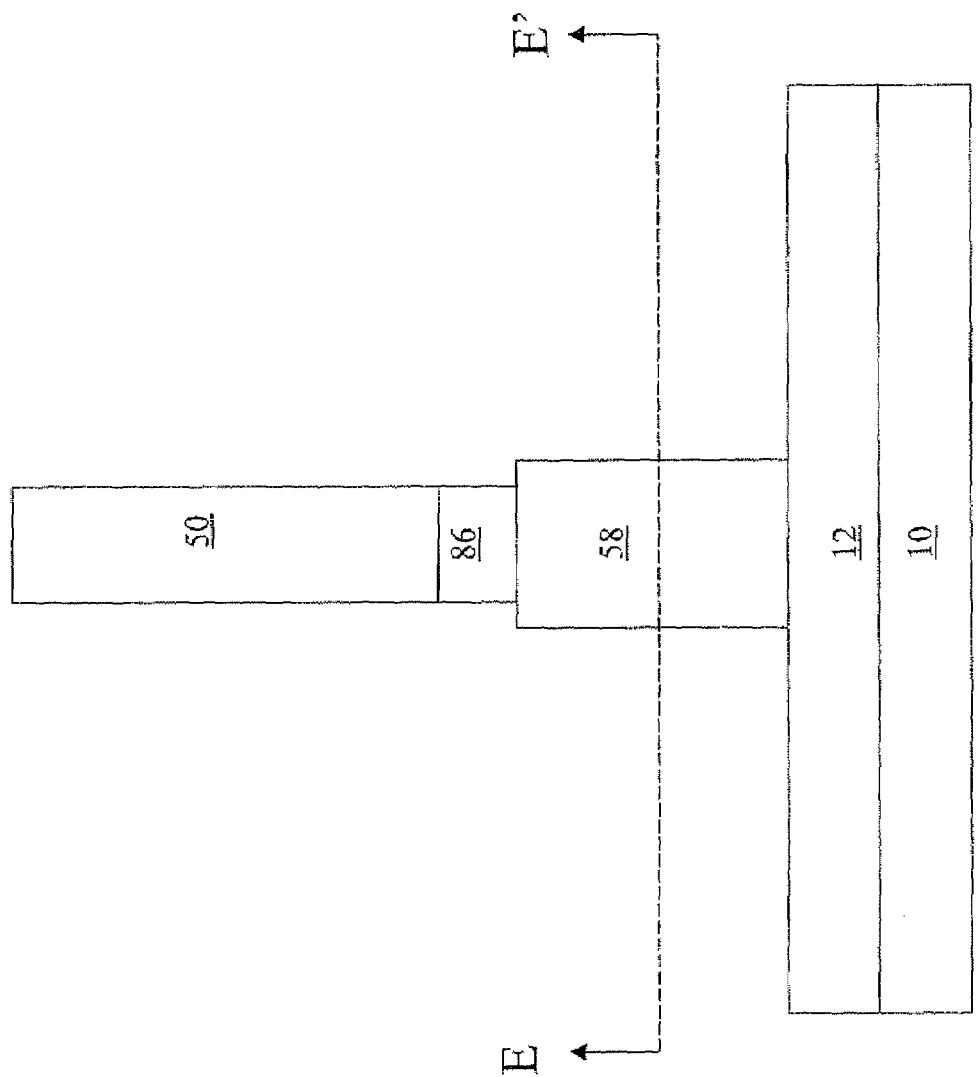
Figure 14E:
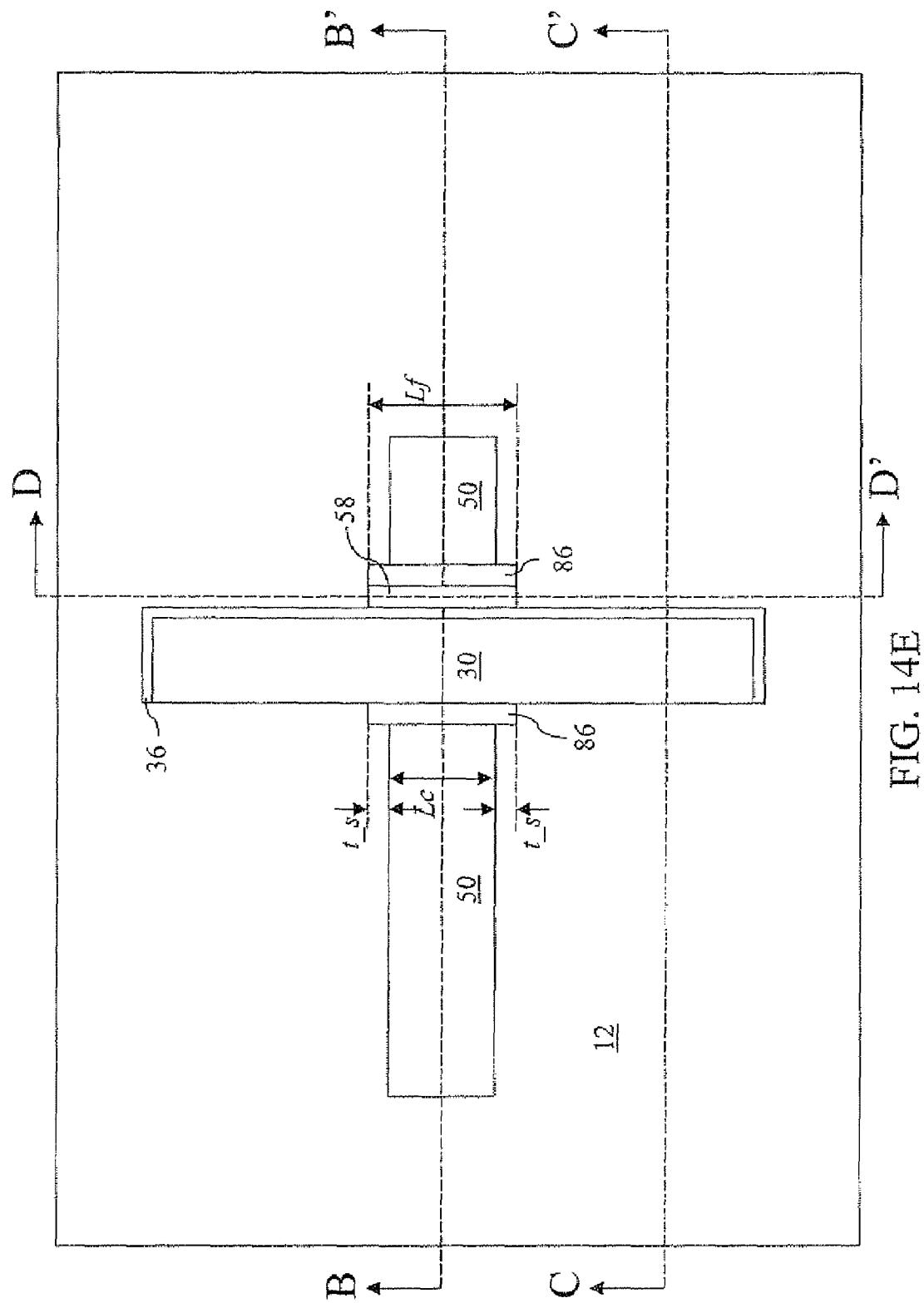

Referring to FIGS. 13A-13D, exposed portions of the second floating gate spacer portion 38B, i.e., the portion of the second floating gate layer that is not covered by the control gate 50 and the gate spacer 52 in the top down view of FIG. 13A, is removed, for example, by a wet etch or a substantially isotropic reactive ion etch. The remaining portion of the second floating gate spacer portion 38B constitutes a floating gate 58. Portions of the floating gate dielectric 36 over the first sidewall 31A of the semiconductor fin 30 is exposed outside the area of intersection between the semiconductor fin 30 and the control gate 50 and the gate spacer 52 in the top down view of FIG. 13A.

Referring to FIGS. 14A-14E, the gate spacer 52 is removed, for example, by a selective wet etch that removed only the material of the gate spacer 52. In one embodiment, the gate spacer 52 comprises silicon nitride and the selective wet etch may comprise a hot phosphoric acid etch. The portions of the control gate dielectric 86 is exposed outside the control gate 50 in the top-down view of FIG. 14A. The dimension of the control gate dielectric 86 in the lengthwise direction of the semiconductor fin 30 is the same as the dimension of the floating gate 59, and is herein referred to as a floating gate length Lf. The floating gate length Lf is the same as the sum of the control gate length Lc and twice the thickness $t\_s$ of the gate spacer 52. In the top-down view and the horizontal cross-sectional view of FIG. 14E, the control gate 50 is centered with respect to the control gate dielectric 86 located on the second sidewall 31B of the semiconductor fin 30 and on the floating gate 58. Further, the control gate 50 is also centered with respect to the floating gate 58 since the floating gate 58 and the control gate dielectric 86 have coincident outer edges of which the location is determined by the thickness $t\_s$ of the gate spacer 52.

Figure 15A:
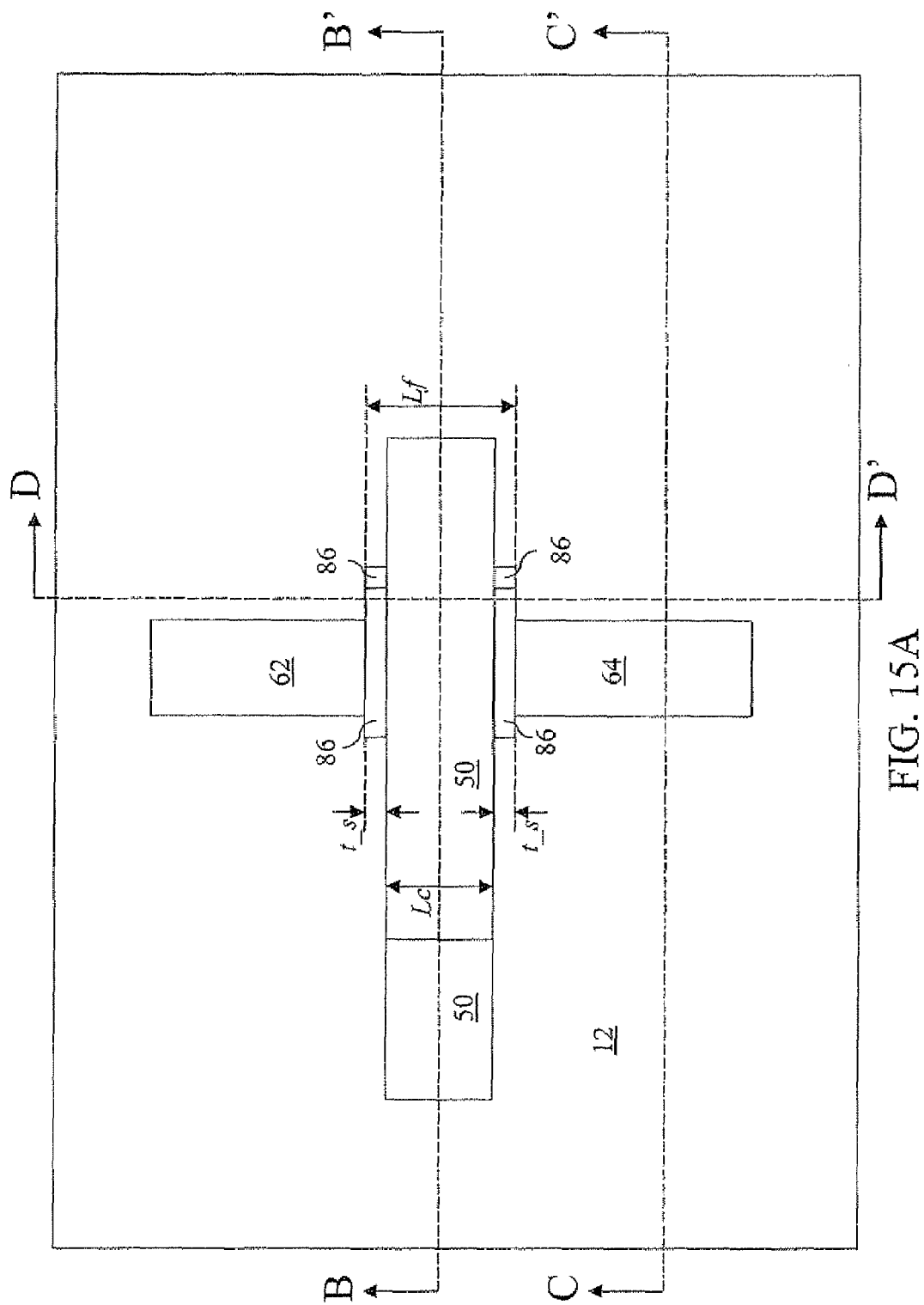
Figure 15B:
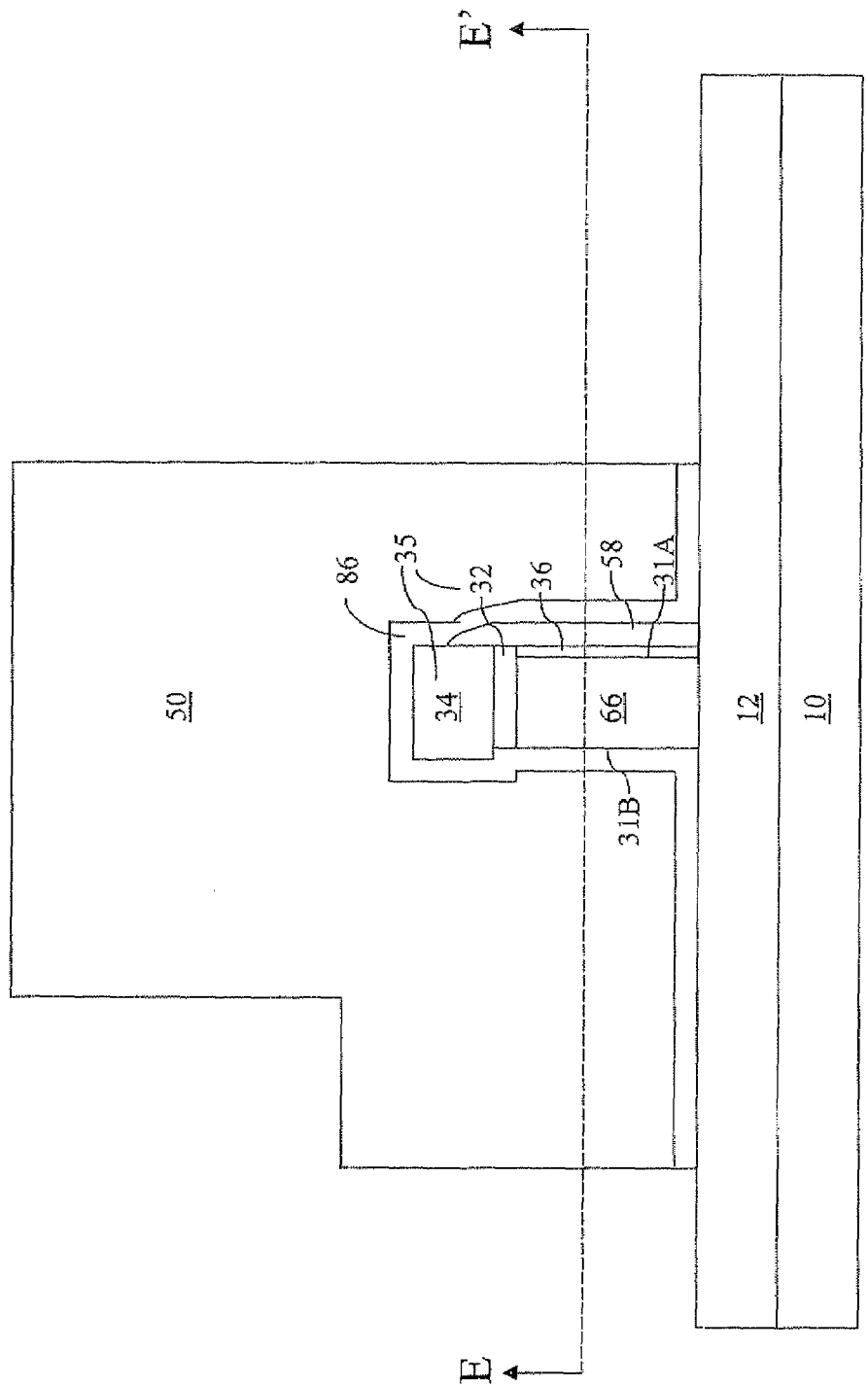
Figure 15D:
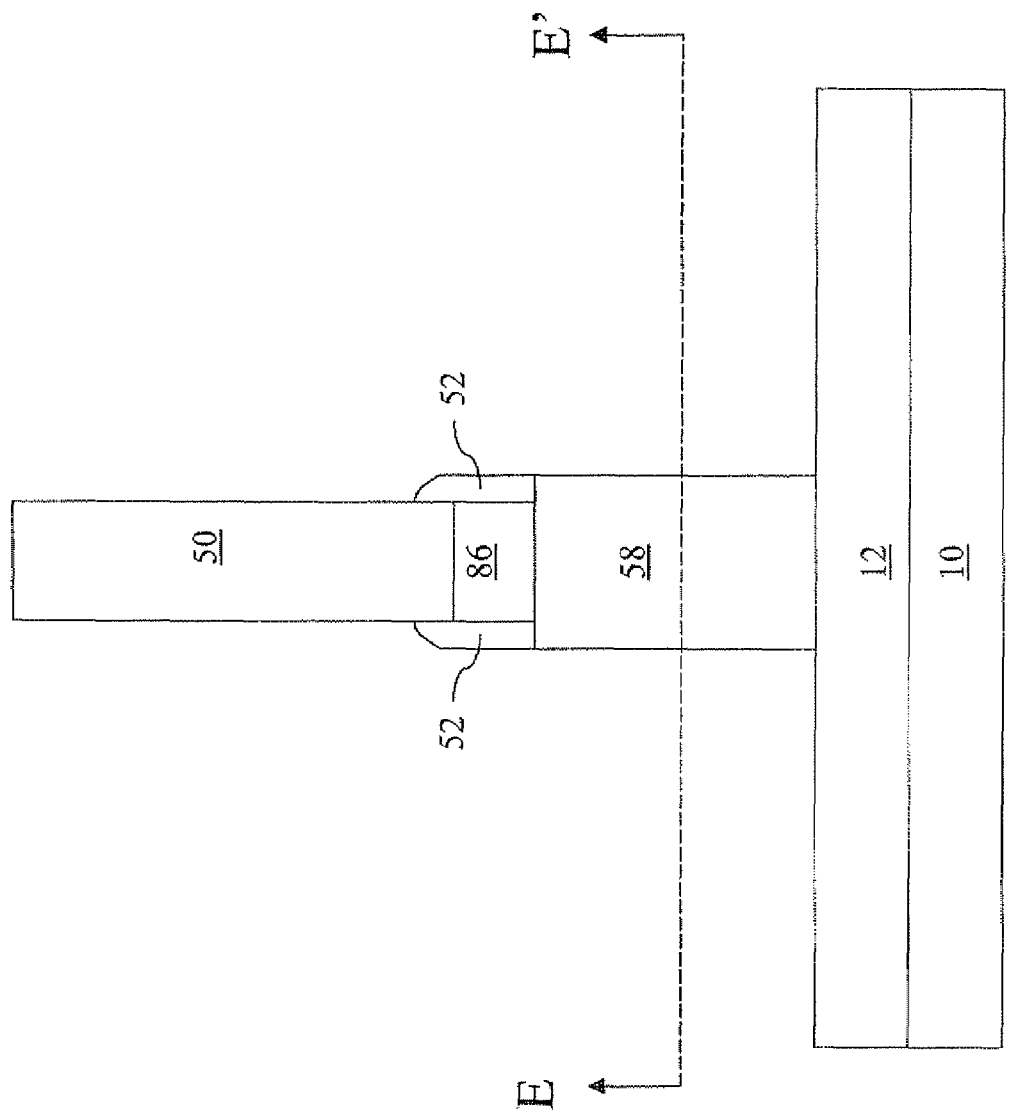
Figure 15E:
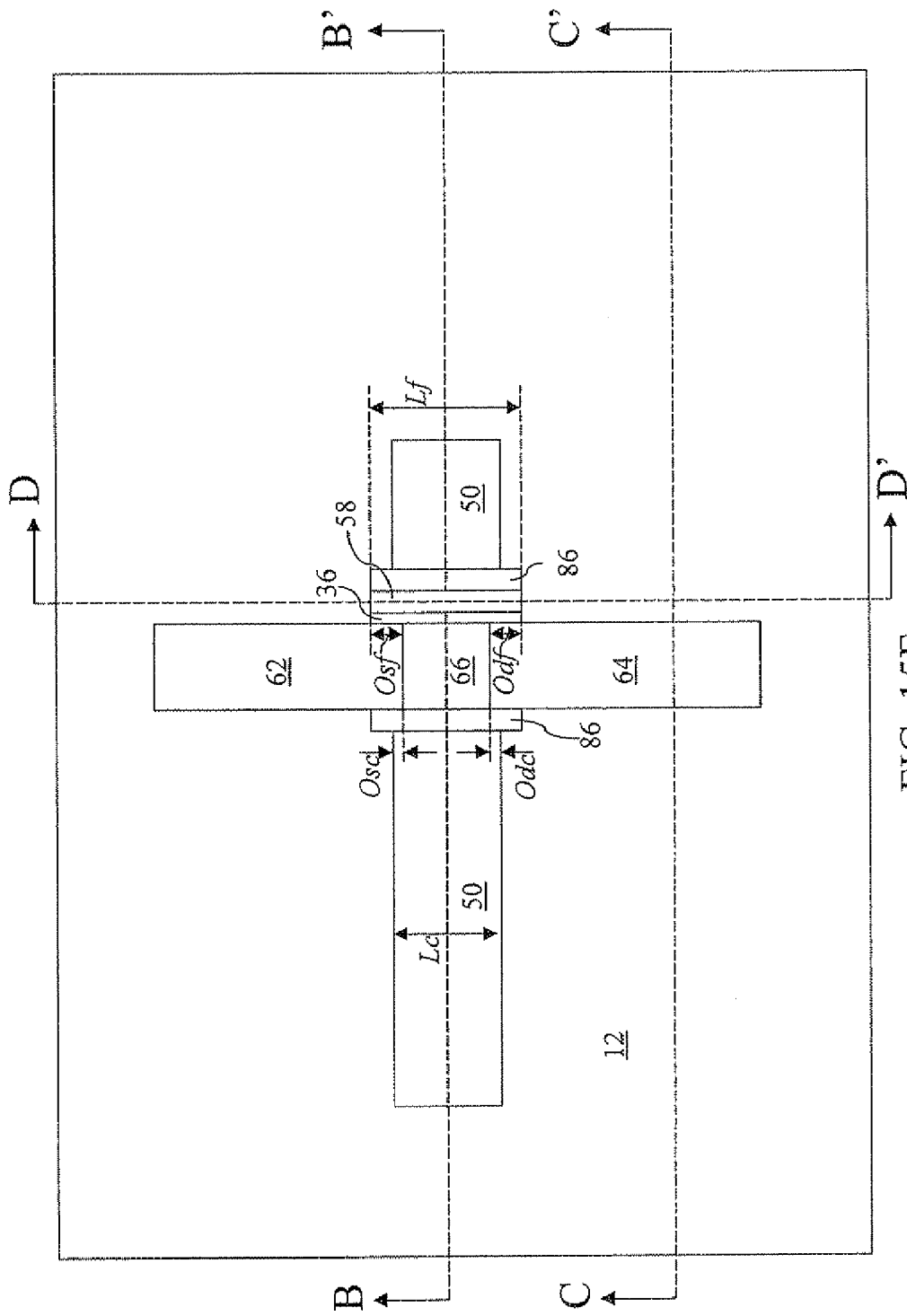

Referring to FIGS. 15A-15E, exposed portions of the at least one fin cap dielectric portion 35, i.e., remaining portions of the at least one fin cap dielectric portion 35, such as the first fin cap dielectric portion 32, that are located outside the area of the control gate 50 and the control gate dielectric 86 in the top-down view of FIG. 15A, are removed, for example, by a wet etch or a substantially isotropic reactive ion etch. Exposed portions of the floating gate dielectric 36, i.e., the portions of the floating gate dielectric 36 that are located outside the area of the control gate 50 and the control gate dielectric 86 in the top-down view, are also removed by an isotropic etch such as a wet etch. In one embodiment, the first fin cap dielectric portion 32 and the floating gate dielectric 36 comprise silicon oxide, and a wet etch employing a hydrofluoric acid removes both the exposed portions of the first fin cap dielectric portion 32 and the exposed portions of the floating gate dielectric 36.

A source and drain extension implantation may be performed into the semiconductor fin 30 employing the control gate 50 as an implantation mask. The source and drain extension implantation implants dopants of a second conductivity type to form source and drain extension regions (not shown). The dose of the source and drain extension implantation is sufficient to change the net doping of the source and drain extension regions into a second conductivity type doping. The source and drain extension region may have a doping concentration from about $1.0 \times 10^{19}$ atoms/cm$^3$ to about $1.0 \times 10^{21}$ atoms/cm$^3$, while lesser and greater doping concentrations are also contemplated herein.

A halo implantation may be performed into the semiconductor fin 30 employing the control gate 50 as an implantation mask. The halo implantation implants dopants of the first conductivity type to form a source side halo region (not shown) and a drain side halo region (not shown). Typical doping concentration of the source side halo region and the drain side halo region may be from about $1.0 \times 10^{17}$ atoms/cm$^3$ to about $1.0 \times 10^{20}$ atoms/cm$^3$, while lesser and greater doping concentrations are also contemplated herein.

Optionally, at least another gate spacer (not shown) may be formed as needed to space edges of source and drain regions from the control gate 50.

A source and drain ion implantation is performed to form a source region 62 and a drain region 64. The source region 62 herein denotes a collection of doped regions located on one end of the semiconductor fin 30 and having a doping of the second conductivity type. The source region 62 therefore includes one of the two regions of the semiconductor fin 30 that are implanted during the source and drain ion implantation and the source extension region if present. Similarly, the drain region 64 herein denotes a collection of doped regions located on an opposite end of the semiconductor fin 30 and having a doping of the second conductivity type. The drain region 64 therefore includes the other of the two regions of the semiconductor fin 30 that are implanted during the source and drain ion implantation and the drain extension region if present. The doping concentration of the source region 62 and the drain region 64 may be from about $1.0 \times 10^{19}$ atoms/cm$^3$ to about $3.0 \times 10^{21}$ atoms/cm$^3$, while lesser and greater doping concentrations are also contemplated herein.

The portion of the semiconductor fin 30 located between the source region 62 and the drain region 64 constitutes a channel region 66. The channel region 66 includes the source side halo region and the drain side halo region if present. The channel region has a doping of the first conductivity type. The channel region 66 laterally abuts the floating gate dielectric 36 at the first sidewall 31A of the semiconductor fin 30, and laterally abuts the control gate dielectric 86 at the second sidewall 32A of the semiconductor fin 30. The first sidewall 31A and the second sidewall 31B are located on opposite sides of the semiconductor fin 30.

The drain region 64 laterally abuts the channel region 66, and overlaps with the floating gate 58 through the floating gate dielectric 36 by a floating gate to drain overlap length Odf, and overlaps with the control gate 50 through the control gate dielectric 86 by a control gate to drain overlap length Odc. The floating gate to drain overlap length Odf is greater than the control gate to drain overlap length Odc by the thickness t_s of the gate spacer 52 (See FIGS. 13A-13D).

Likewise, the source region 62 laterally abuts the channel region 66, and overlaps with the floating gate 58 through the floating gate dielectric 36 by a floating gate to source overlap length Osf, and overlaps with the control gate 50 through the control gate dielectric 86 by a control gate to source overlap length Osc. The floating gate to source overlap length Osf is greater than the control gate to source overlap length Osc by the thickness t_s of the gate spacer 52 (See FIGS. 13A-13D).

The source and drain ion implantation may be performed symmetrically. In this case, the source region 62 and the drain region 64 have substantially the same lateral extent of the edges toward the control gate 50. The floating gate to drain overlap length Odf is substantially the same as the floating gate to source overlap length Osf, and the control gate to drain overlap length Odc is substantially the same as the control gate to source overlap length Osc.

The inventive flash memory device comprises the control gate 50, the floating gate 59, and the semiconductor fin 30 containing the source region 62, the drain region 64, and the channel region 66. The increase in the floating gate to drain overlap length Odf relative to the control gate to drain overlap length Odc increases a capture rate of hot carriers generated in the drain region 64. The increase in the capture rate may be substantial since the majority of hot carriers are forward scattered. Further, the floating gate dielectric 36 and the control gate dielectric 86 may be independently optimized for best device performance.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
    a semiconductor fin comprising a semiconductor material and located on a substrate;
    a floating gate dielectric abutting a sidewall of said semiconductor fin;
    a floating gate laterally abutting said floating gate dielectric and having a floating gate length;
    a control gate dielectric laterally abutting said floating gate and another sidewall of said semiconductor fin; and
    a control gate abutting said control gate dielectric and having a control gate length, wherein said floating gate length is greater than said control gate length.

2. The semiconductor of claim 1, wherein said semiconductor fin comprises:
    a channel region laterally abutting said floating gate dielectric and said control gate dielectric and having a first conductivity type doping ; and
    a drain region laterally abutting said channel region and having a second conductivity type doping, wherein said second conductivity type is the opposite of said first conductivity type, and wherein said drain region overlaps with said floating gate through said floating gate dielectric by a floating gate to drain overlap length, and wherein said drain region overlaps with said control gate through said control gate dielectric by a control gate to drain overlap length, and wherein said floating gate to drain overlap length is greater than said control gate to drain overlap length.

3. The semiconductor structure of claim 2, wherein said semiconductor fin further comprises a source region laterally abutting said channel region and having said second conductivity type doping, wherein said source region overlaps with said floating gate through said floating gate dielectric by a floating gate to source overlap length, wherein said source region overlaps with said control gate through said control gate dielectric by a control gate to source overlap length, and wherein said floating gate to source overlap length is greater than said control gate to source overlap length.

4. The semiconductor structure of claim 3, wherein said floating gate to drain overlap length is substantially the as said floating gate to source overlap length, and wherein said control gate to drain overlap length is substantially the same as said control gate to source overlap length.

5. The semiconductor of claim 1, further comprising at least one fin cap dielectric portion abutting said semiconductor fin, said control gate dielectric, and said floating gate.

6. The semiconductor structure of claim 5, wherein said at least one fin cap dielectric portion comprises:
    a first fin cap dielectric portion vertically abutting said semiconductor fin and abutting said control gate dielectric and said floating gate; and
    a second fin cap dielectric portion vertically abutting said first cap dielectric portion and abutting said control gate dielectric.

7. The semiconductor of claim 1, wherein a length of said control gate dielectric is the same as said floating gate length.

8. The semiconductor structure of claim 1, wherein said floating gate dielectric and said control gate dielectric have a different effective oxide thicknesses.

9. The semiconductor of claim 1, wherein said floating gate dielectric and said control gate dielectric comprise different materials.

10. The semiconductor structure of claim 9, wherein said floating gate dielectric is one of silicon oxide, silicon nitride, silicon oxynitride and a stack thereof, and wherein said control gate dielectric comprises a high-k dielectric material.

11. The semiconductor structure of claim 10, wherein said high-k dielectric material is one of $HfO_2$, $ZrO_2$, $La_2O_3$, $Al_2O_3$, $TiO_2$, $SrTiO_3$, $LaAlO_3$, $Y_2O_3$, an alloy thereof, and a silicate thereof.

12. The semiconductor structure of claim 1, wherein said semiconductor fin comprises silicon and said floating gate comprises a silicon germanium alloy.

13. The semiconductor structure of claim 1, wherein said another sidewall is located on an opposite side of said sidewall, and wherein said substrate comprises a handle substrate and a buried insulator layer, wherein said buried insulator layer vertically abuts said handle substrate and said semiconductor fin.

14. A method forming a semiconductor structure comprising:
    forming a semiconductor fin comprising a semiconductor material on a substrate;
    forming a floating gate dielectric directly of a sidewall of said semiconductor fin;
    forming a floating gate layer directly on said floating gate dielectric;
    forming a control gate dielectric layer directly on another sidewall of said semiconductor fin and said floating gate;
    forming a control gate having a control gate length in a lengthwise direction of said semiconductor fin directly on said control gate dielectric;
    forming a gate spacer having a gate spacer thickness on gate electrode sidewalls; and
    removing exposed portions of said floating gate layer employing said gate electrode and said gate spacer as an etch mask to form a floating gate having a floating gate length, wherein said floating gate length is greater than said control gate length.

15. The method of claim 14, further comprising removing exposed portions of said control gate dielectric at the same step as said removing of said exposed portions of said floating gate layer to form a control gate dielectric having said floating gate length.

16. The method of claim 15, further comprising forming a drain region in said semiconductor fin, wherein said drain region overlaps with said floating gate through said floating gate dielectric by a floating gate to drain overlap length, and wherein said drain region overlaps with said control gate through said control gate dielectric by a control gate to drain overlap length, and wherein said floating gate to drain overlap length is greater than said control gate to drain overlap length.

17. The method of claim 16, further comprising forming a source region in said semiconductor fin, wherein said source region overlaps with said floating gate through said floating gate dielectric by a floating gate to source overlap length, and wherein said source region overlaps with said control gate through said control gate dielectric by a control gate to source overlap length, and wherein said floating gate to source overlap length is greater than said control gate to source overlap length.

18. The method of claim 17, wherein said floating gate to drain overlap length is substantially the same as said floating gate to source overlap length, and wherein said control gate to drain overlap length is substantially the same as said control gate to source overlap length.

19. The method of claim 14, further comprising:
    forming said floating gate dielectric directly on another sidewall of said semiconductor fin located on an opposite side of said sidewall;
    etching said floating gate layer by a reactive ion etch to form a floating gate spacer around said semiconductor fin; and
    removing one side of said floating gate spacer.

20. The method of claim 14, wherein said floating gate length is the same as the sum of said control gate length and twice said gate spacer thickness.

* * * * *